US010938372B2

(12) United States Patent
Komiyama et al.

(10) Patent No.: US 10,938,372 B2
(45) Date of Patent: Mar. 2, 2021

(54) ACOUSTIC WAVE RESONATOR, ACOUSTIC WAVE DEVICE, AND FILTER

(71) Applicant: TAIYO YUDEN CO., LTD., Tokyo (JP)

(72) Inventors: Ryohei Komiyama, Tokyo (JP); Hitoshi Tsukidate, Tokyo (JP); Shinji Yamamoto, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 16 days.

(21) Appl. No.: 16/390,739

(22) Filed: Apr. 22, 2019

(65) Prior Publication Data
US 2019/0356297 A1 Nov. 21, 2019

(30) Foreign Application Priority Data

May 17, 2018 (JP) .............................. JP2018-095004
Feb. 7, 2019 (JP) .............................. JP2019-020791

(51) Int. Cl.
H03H 9/02 (2006.01)
H03H 3/10 (2006.01)
(Continued)

(52) U.S. Cl.
CPC ..... H03H 9/02866 (2013.01); B23K 26/0006 (2013.01); B23K 26/53 (2015.10);
(Continued)

(58) Field of Classification Search
CPC .. H03H 9/02866; H03H 3/10; H03H 9/02559; H03H 9/02637; H03H 9/02834;
(Continued)

(56) References Cited

U.S. PATENT DOCUMENTS 7,579,759 B2 * 8/2009 Lee .................... H03H 9/02574
310/313 R
7,745,240 B2 6/2010 Furuya .......................... 438/22
(Continued)

FOREIGN PATENT DOCUMENTS

JP 2002-222777 A 8/2002
JP 2004-336503 A 11/2004
(Continued)

OTHER PUBLICATIONS

Iriarte et al.,"Surface acoustic wave propagation characteristics of aluminum nitride thin films grown on polycrystalline diamond", Journal of Applied Physics, vol. 93, No. 12, Jun. 2003 (Year: 2003).*
(Continued)

Primary Examiner — Benny T Lee
Assistant Examiner — Hafizur Rahman
(74) Attorney, Agent, or Firm — Stein IP, LLC

(57) ABSTRACT

An acoustic wave resonator includes: a piezoelectric substrate; a pair of comb-shaped electrodes that is located on the piezoelectric substrate and excites an acoustic wave, each of the pair of comb-shaped electrodes including a plurality of electrode fingers; and a polycrystalline substrate that is located at an opposite side of the piezoelectric substrate from a surface on which the pair of comb-shaped electrodes is located, an average particle size of the polycrystalline substrate being equal to or less than 66 times an average pitch of the plurality of electrode fingers.

19 Claims, 21 Drawing Sheets

(51) Int. Cl.

| | | |
|---|---|---|
| *H03H 9/145* | (2006.01) | |
| *H03H 9/64* | (2006.01) | |
| *H03H 9/72* | (2006.01) | |
| *B23K 26/53* | (2014.01) | |
| *B23K 26/00* | (2014.01) | |
| *H03H 9/25* | (2006.01) | |
| *H01L 41/338* | (2013.01) | |
| *H01L 41/312* | (2013.01) | |

(52) U.S. Cl.
CPC .......... *H03H 3/10* (2013.01); *H03H 9/02559* (2013.01); *H03H 9/02637* (2013.01); *H03H 9/02834* (2013.01); *H03H 9/145* (2013.01); *H03H 9/25* (2013.01); *H03H 9/6483* (2013.01); *H03H 9/6489* (2013.01); *H03H 9/725* (2013.01); *H01L 41/312* (2013.01); *H01L 41/338* (2013.01)

(58) Field of Classification Search
CPC ........ H03H 9/145; H03H 9/25; H03H 9/6483; H03H 9/6489; H03H 9/725; B23K 26/53; B23K 26/0006; H01L 41/312; H01L 41/338
USPC .......................................................... 333/194
See application file for complete search history.

(56) References Cited

U.S. PATENT DOCUMENTS

| | | | |
|---|---|---|---|
| 7,964,475 B2 | 6/2011 | Haraguchi et al. ........... | 438/463 |
| 2004/0222717 A1 | 11/2004 | Matsuda et al. .......... | 310/313 R |
| 2004/0226162 A1 | 11/2004 | Miura et al. .................... | 29/594 |
| 2014/0020822 A1 | 1/2014 | Shimizu ........................ | 156/250 |
| 2014/0051233 A1* | 2/2014 | Agarwal ............ | H01L 21/6836 |
| | | | 438/462 |
| 2017/0033765 A1 | 2/2017 | Moriya et al. | |
| 2019/0280666 A1* | 9/2019 | Akiyama ............... | B23K 20/00 |

FOREIGN PATENT DOCUMENTS

| | | | | |
|---|---|---|---|---|
| JP | 2004-343359 A | 12/2004 | | |
| JP | 2014-22966 A | 2/2014 | | |
| JP | 2017-34363 A | 2/2017 | | |
| WO | WO-2012033125 A1 * | 3/2012 | ............ | C04B 35/443 |

OTHER PUBLICATIONS

Microdiamant AG data sheet for FG micron diamond® powder, first visited on Oct. 2016 according to Internet Archive, WayBack machine. (Year: 2016).*

"Saw Resonators for Quantum Information", by Manenti, published by Universita Degli Studi di Milano in 2003 (Year: 2003).*

Geshi et al.,"Wafer Bonding of Polycrystalline Spinel with LiNbO3/LiTaO3 for Temperature Compensation of RF Surface Acoustic Wave Devices", SEI Technical Review, No. 75, Oct. 2012, pp. 116-119. (Year: 2012).*

PC Magazine encyclopedia of electronic terminology, Surface Acoustic Wave Resonator, © 1996-2020 Ziff Davis, LLC. PCMag Digital Group (Year: 1996).*

* cited by examiner

ACOUSTIC WAVE RESONATOR, ACOUSTIC WAVE DEVICE, AND FILTER

CROSS-REFERENCE TO RELATED APPLICATION

This application is based upon and claims the benefits of priority of the prior Japanese Patent Application No. 2018-095004, filed on May 17, 2018, and the prior Japanese Patent Application No. 2019-020791, filed on Feb. 7, 2019, the entire contents of which are incorporated herein by reference.

FIELD

A certain aspect of the present invention relates to an acoustic wave resonator, an acoustic wave device, and a filter.

BACKGROUND

There have been known surface acoustic wave resonators as acoustic wave resonators used in communication devices such as smartphones. It has been known that a piezoelectric substrate forming the surface acoustic wave resonator is bonded to a support substrate. It has been known that the thickness of the piezoelectric substrate is configured to be equal to or less than the wavelength of the surface acoustic wave as disclosed in, for example, Japanese Patent Application Publication No. 2017-034363 (hereinafter, referred to as Patent Document 1).

SUMMARY OF THE INVENTION

According to a first aspect of the present invention, there is provided an acoustic wave resonator including: a piezoelectric substrate; a pair of comb-shaped electrodes that is located on the piezoelectric substrate and excites an acoustic wave, each of the pair of comb-shaped electrodes including a plurality of electrode fingers; and a polycrystalline substrate that is located at an opposite side of the piezoelectric substrate from a surface on which the pair of comb-shaped electrodes is located, an average particle size of the polycrystalline substrate being equal to or less than 66 times an average pitch of the plurality of electrode fingers.

According to a second aspect of the present invention, there is provided a filter including: the above acoustic wave resonator.

According to a third aspect of the present invention, there is provided an acoustic wave device including: a pair of comb-shaped electrodes; a piezoelectric substrate on which the pair of comb-shaped electrodes is located, the piezoelectric substrate having, in a side portion, a first region having a different crystal structure from a region overlapping with the pair of comb-shaped electrodes; and a support substrate that is located at an opposite side of the piezoelectric substrate from the pair of comb-shaped electrodes, the support substrate having, in a side portion, a second region having a different crystal structure from a region overlapping with the pair of comb-shaped electrodes in plan view.

DETAILED DESCRIPTION

When the piezoelectric substrate is bonded to the support substrate, the temperature characteristic of the surface acoustic wave resonator is improved. Furthermore, when the thickness of the piezoelectric substrate is configured to be equal to or less than the wavelength of the surface acoustic wave, the loss and spurious are reduced. However, reduction in spurious is insufficient.

Hereinafter, a description will be given of embodiments of the present invention with reference to the accompanying drawings.

First Embodiment

Figure 1A:
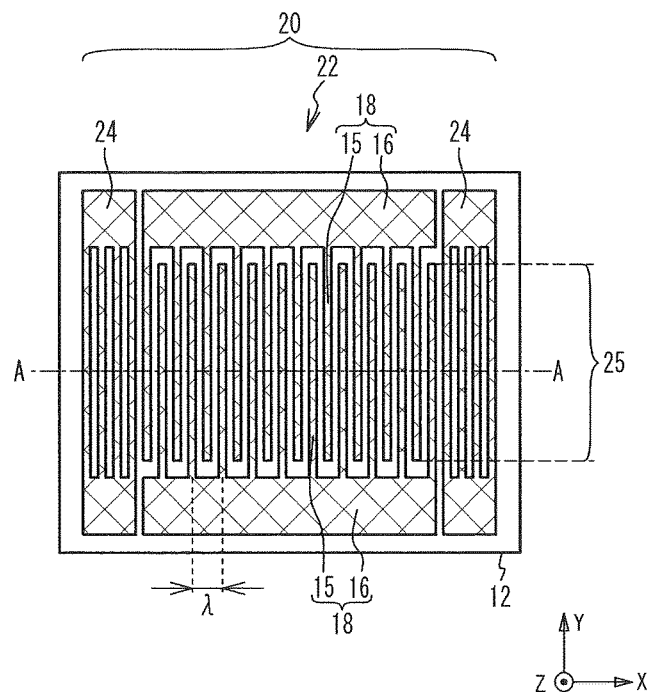
FIG. 1A is a plan view of an acoustic wave resonator in a first embodiment.
Figure 1B:
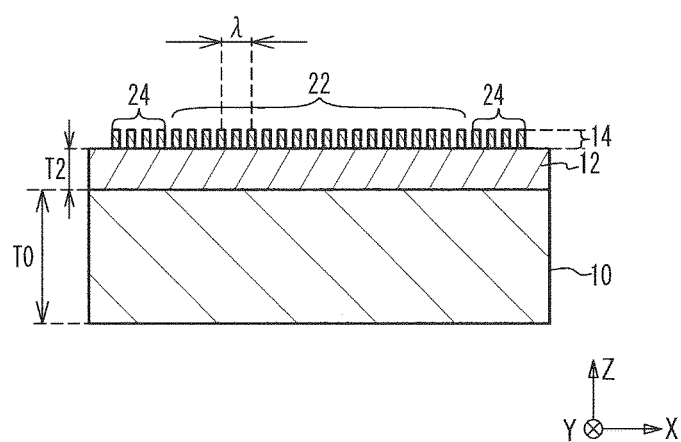
FIG. 1B is a cross-sectional view taken along line A-A in FIG. 1A.

FIG. 1A is a plan view of an acoustic wave resonator in a first embodiment, and FIG. 1B is a cross-sectional view taken along line A-A in FIG. 1A. The direction in which electrode fingers are arranged is defined as an X direction, the direction in which the electrode finger extends is defined as a Y direction, and the direction in which a support substrate and a piezoelectric substrate are stacked is defined as a Z direction. The X direction, the Y direction, and the Z direction do not necessarily correspond to the X-axis orientation and the Y-axis orientation of the crystal orientation of the piezoelectric substrate. When the piezoelectric substrate is a rotated Y-cut X-propagation substrate, the X direction corresponds to the X-axis orientation of the crystal orientation.

As illustrated in FIG. 1A and FIG. 1B, a piezoelectric substrate 12 is stacked on a polycrystalline substrate 10. The thicknesses of the polycrystalline substrate 10 and the piezoelectric substrate 12 are represented by T0 and T2, respectively. An acoustic wave resonator 20 is located on the piezoelectric substrate 12. The acoustic wave resonator 20 includes an interdigital transducer (IDT) 22 and reflectors 24. The reflectors 24 are located at both sides of the IDT 22 in the X direction. The IDT 22 and the reflectors 24 are formed of a metal film 14 on the piezoelectric substrate 12.

The IDT 22 includes a pair of comb-shaped electrodes 18. The comb-shaped electrode 18 includes a plurality of electrode fingers 15 and a bus bar 16 to which the electrode fingers 15 are coupled. The region where the electrode fingers 15 of a pair of the comb-shaped electrodes 18 overlap is an overlap region 25. The length of the overlap region 25 corresponds to an aperture length. A pair of the comb-shaped electrodes 18 are arranged so as to face each other so that the electrode fingers 15 of one of the comb-shaped electrodes 18 and the electrode fingers 15 of the other are substantially alternately arranged in at least a part of the overlap region 25. The acoustic wave excited by the electrode fingers 15 in the overlap region 25 propagates in the X direction. The pitch of the electrode fingers 15 of one of a pair of the comb-shaped electrodes 18 corresponds to the wavelength $\lambda$ of the acoustic wave. The wavelength $\lambda$ of the acoustic wave corresponds to approximately the pitch of two electrode fingers 15. The reflectors 24 reflect the acoustic wave (the surface acoustic wave) excited by the electrode fingers 15 of the IDT 22. Accordingly, the acoustic wave is confined in the overlap region 25 of the IDT 22.

The piezoelectric substrate 12 is a monocrystalline (single-crystal) substrate, is, for example, a lithium tantalate ($LiTaO_3$) substrate or a lithium niobate ($LiNbO_3$) substrate, and is, for example, a rotated Y-cut X-propagation lithium tantalate substrate or a rotated Y-cut X-propagation lithium niobate substrate. The polycrystalline substrate 10 is, for example, a spinel ($MgAl_2O_4$) substrate, a silicon (Si) substrate, or an alumina ($Al_2O_3$) substrate. The linear expansion coefficient of the polycrystalline substrate 10 in the X direction is less than the linear expansion coefficient of the piezoelectric substrate 12 in the X direction. Thus, the temperature coefficient of resonant frequency or the like of the acoustic wave resonator can be made to be small.

The metal film 14 is a film mainly composed of, for example, aluminum (Al) or copper (Cu), and is, for example, an Al film or a Cu film. An adhesion film such as a titanium (Ti) film or a chrome (Cr) film may be located between the electrode finger 15 and the piezoelectric substrate 12. The adhesion film is thinner than the electrode finger 15. An insulating film may be provided so as to cover the electrode fingers 15. The insulating film functions as a protective film or a temperature compensation layer.

The thickness T0 is, for example, 50 μm to 500 μm. The thickness T2 is, for example, 0.5 μm to 20 μm, and is, for example, 10λ or less, 1λ or less. When two electrode fingers 15 makes a pair, the number of pairs is, for example, 20 pairs to 300 pairs. The duty ratio of the IDT 22 is calculated by dividing the width of the electrode finger 15 by the pitch of the electrode fingers 15, and is, for example, 30% to 70%. The aperture length of the IDT 22 is, for example, 10λ to 50λ.

Fabrication Method of the First Embodiment

Figure 2A:
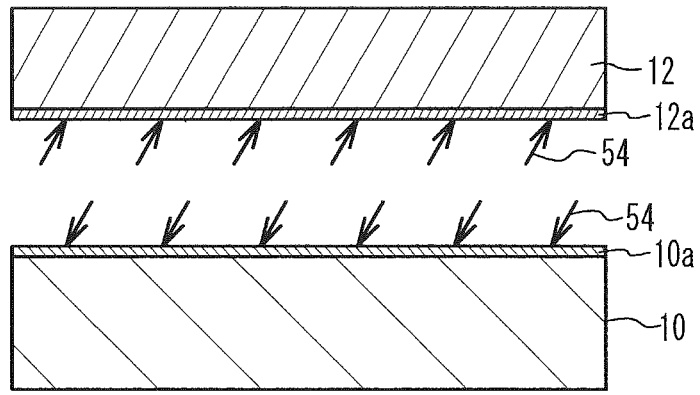
FIG. 2A through FIG. 2D are cross-sectional views illustrating a method of fabricating the acoustic wave resonator in accordance with the first embodiment.

FIG. 2A through FIG. 2D are cross-sectional views illustrating a method of fabricating the acoustic wave resonator in accordance with the first embodiment. As illustrated in FIG. 2A, the upper surface of the polycrystalline substrate 10 and the lower surface of the piezoelectric substrate 12 are irradiated with ions 54. The ion 54 is the ion of an inert element (for example, noble gasses) such as, for example, an argon (Ar) ion. The ions 54 are emitted as an ion beam, a neutralized beam, or plasma. Through this process, an amorphous layer 10a, which is in contact with the polycrystalline substrate 10, is formed on the upper surface of the polycrystalline substrate 10, and an amorphous layer 12a, which is in contact with the piezoelectric substrate 12, is formed on the lower surface of the piezoelectric substrate 12. Dangling bonds are formed on the surfaces of the amorphous layer 10a and 12a (i.e., the surfaces of the amorphous layer 10a and 12a are activated).

Figure 2B:
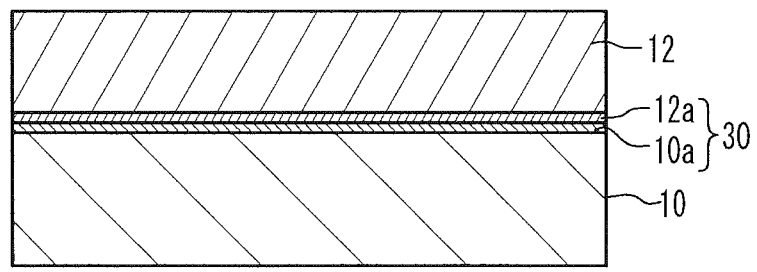

As illustrated in FIG. 2B, when the amorphous layers 10a and 12a are put together while a vacuum is maintained, the dangling bonds are bonded together, and a strong bond is achieved. Accordingly, the polycrystalline substrate 10 and the piezoelectric substrate 12 are bonded. Since the above-described bonding is conducted at normal temperature (for example, 100° C. or less and −20° C. or greater, preferably 80° C. or less and 0° C. or greater), the thermal stress is reduced. Whether bonding is conducted at normal temperature or not can be checked by the temperature dependence of the residual stress. That is, the residual stress is the smallest at the temperature at which the bonding was conducted. An amorphous layer 30 formed of the amorphous layers 10a and 12a is formed.

The amorphous layer 10a is mainly composed of one or more constituent element of the polycrystalline substrate 10, and contains an element for surface activation (for example, Ar). When the polycrystalline substrate 10 is a spinel substrate, the amorphous layer 10a is mainly composed of magnesium (Mg), aluminum (Al), and oxygen (O), and contains the element for surface activation. The amorphous layer 12a is mainly composed of one or more constituent elements of the piezoelectric substrate 12, and contains the element for surface activation. When the piezoelectric substrate 12 is a lithium tantalate substrate, the amorphous layer 12a is mainly composed of tantalum (Ta), lithium (Li), and O, and contains the element for surface activation. The amorphous layer 10a contains almost no constituent element of the piezoelectric substrate 12 except the constituent element of the polycrystalline substrate 10. For example, the amorphous layer 10a contains almost no Ta and Li. The amorphous layer 12a contains almost no constituent element of the polycrystalline substrate 10 except the constituent element of the piezoelectric substrate 12. For example, the amorphous layer 12a contains almost no Mg and Al.

The thicknesses of the amorphous layers 10a and 12a are preferably greater than 0 nm, more preferably 1 nm or greater. This configuration improves the bondability between the polycrystalline substrate 10 and the piezoelectric substrate 12. The thicknesses of the amorphous layers 10a and 12a are preferably 10 nm or less, more preferably 5 nm or less. This configuration reduces the deterioration in characteristics of the acoustic wave resonator. Since the thickness of the amorphous layer 30 is much less than the thicknesses of the polycrystalline substrate 10 and the piezoelectric substrate 12, the polycrystalline substrate 10 and the piezoelectric substrate 12 are practically directly bonded. The polycrystalline substrate 10, the piezoelectric substrate 12, and the amorphous layers 10a and 12a can be observed by transmission electron microscopy (TEM).

Figure 2C:
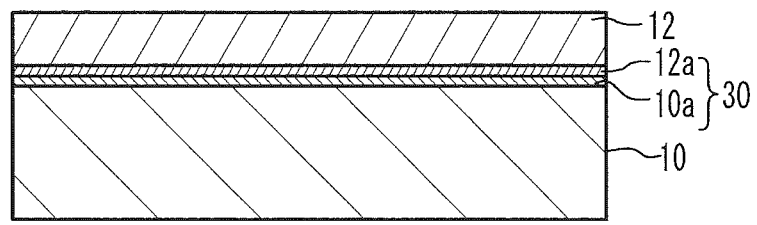
Figure 2D:
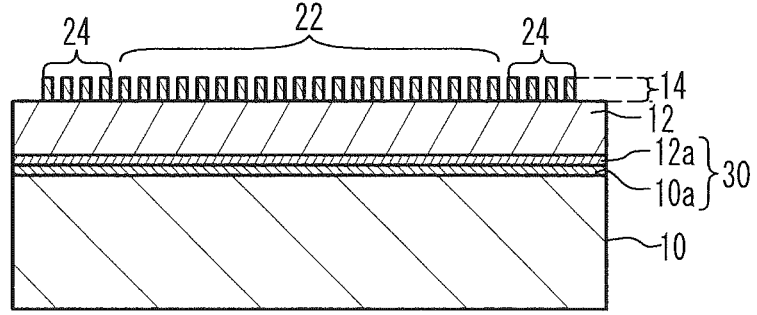

As illustrated in FIG. 2C, the upper surface of the piezoelectric substrate 12 is planarized by, for example, chemical mechanical polishing (CMP). Through this process, the thickness of the piezoelectric substrate 12 becomes T2. As illustrated in FIG. 2D, the IDT 22 and the reflectors 24 formed of the metal film 14 are formed on the upper surface of the piezoelectric substrate 12.

Figure 3:
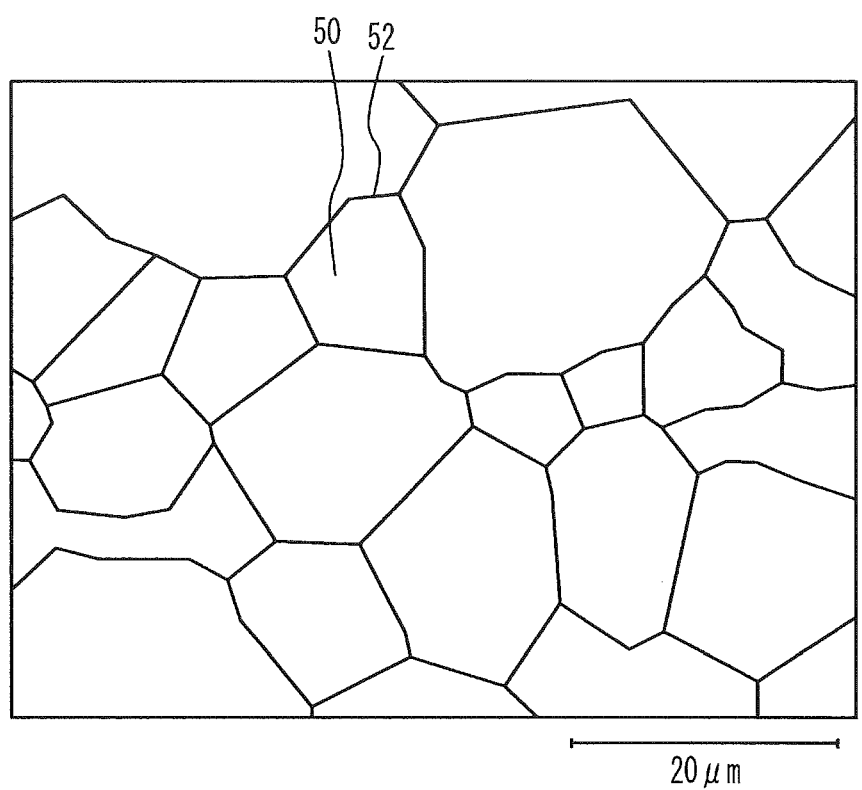
FIG. 3 reproduces an SEM image of the cross-section of a spinel substrate that is polycrystalline.

FIG. 3 reproduces a scanning electron microscope (SEM) image of the cross-section of a spinel substrate that is polycrystalline. A plurality of crystal grains 50 and grain boundaries 52 between the crystal grains 50 are observed. The average particle size of the polycrystalline substrate 10 is measured as follows. The diameter of the circle having an area equal to the cross-section area of the crystal grain 50 is defined as a particle size. The particle sizes of the crystal grains 50 in a 90 μm×90 μm SEM image are measured, and the average of the particle size is calculated.

Experiment

When the thickness T2 of the piezoelectric substrate 12 is configured to be equal to or less than the wavelength λ of the acoustic wave, spurious due to a bulk wave is reduced. However, the reduction in spurious occurring at frequencies higher than the antiresonant frequency is insufficient. Thus, ladder-type filters including acoustic wave resonators having spinet substrates with different average particle sizes as a support substrate were fabricated. The fabricated ladder-type filter has five series resonators and four parallel resonators. Other fabrication conditions are as follows.

Polycrystalline substrate 10: Polycrystalline spinel substrate produced by sintering
Thickness T0: 150 μm
Piezoelectric substrate 12: 42° rotated Y-cut X-propagation lithium tantalate substrate
Thickness T2: 1.3 μm One acoustic wave resonator of the acoustic wave resonators in the ladder-type filter was configured as follows. The remaining acoustic wave resonators were appropriately configured so that the desired filter characteristics were achieved.
Wavelength λ of the acoustic wave: 1.6 μm
Number of pairs in the IDT 22: 100 pairs
Aperture length: 25λ
Duty ratio: 50%

The wavelength λ of the acoustic wave is approximately twice the average pitch of the electrode fingers 15 of the IDT 22.

Figure 4A:
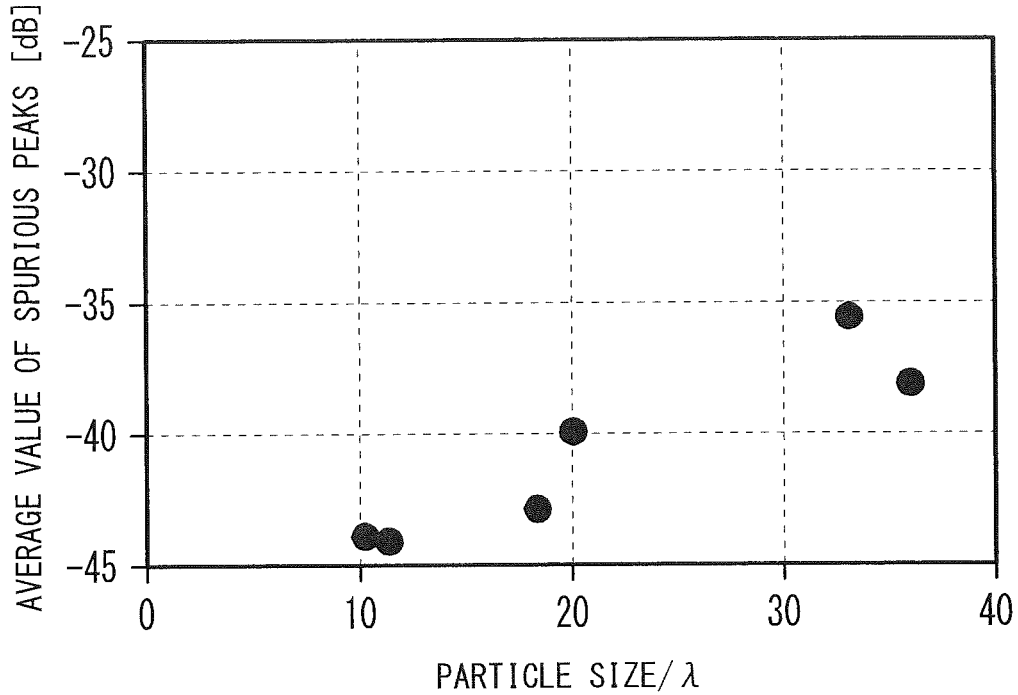
FIG. 4A is a graph of the average value of spurious peaks versus a particle size in samples A through C.
Figure 4B:
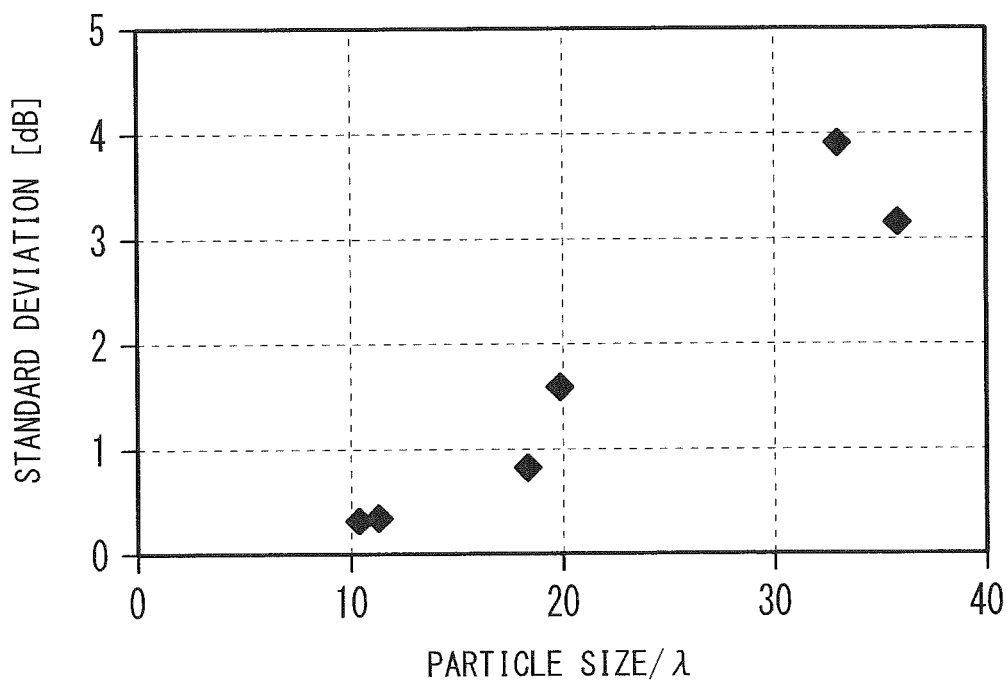
FIG. 4B is a graph of the standard deviation of spurious peaks versus a particle size in samples A through C.

The average particle size of the polycrystalline substrate 10 in each of samples A through C is as follows.
Sample A: 17 μm
Sample B: 30 μm
Sample C: 54 μm Spurious and the transmission characteristics of the fabricated ladder-type filters were measured. FIG. 4A is a graph of the average value of spurious peaks versus the particle size in the samples A through C, and FIG. 4B is a graph of the standard deviation of spurious peaks versus the particle size in the samples A through C. The average value of spurious peaks indicates the average value of peak values of spurious in the wafer plane in each sample, and the standard deviation indicates the standard deviation of peak values of spurious in the wafer plane in each sample. λ represents the pitch of two electrode fingers 15. As illustrated in FIG. 4A and FIG. 4B, as the particle size decreases, the spurious peak value decreases, and the standard deviation decreases.

Figure 5A:
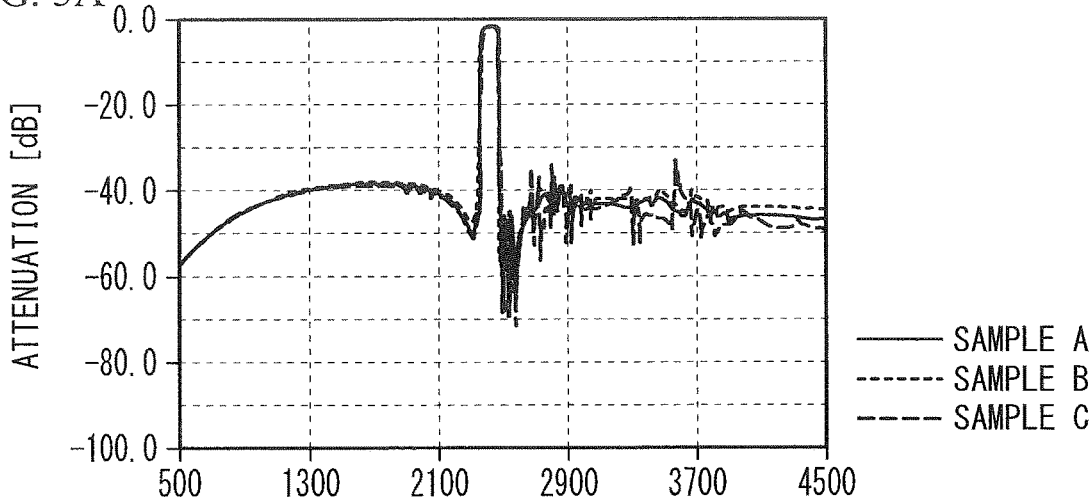
FIG. 5A through FIG. 5C illustrate the transmission characteristics of ladder-type filters in the samples A through C.
Figure 5B:
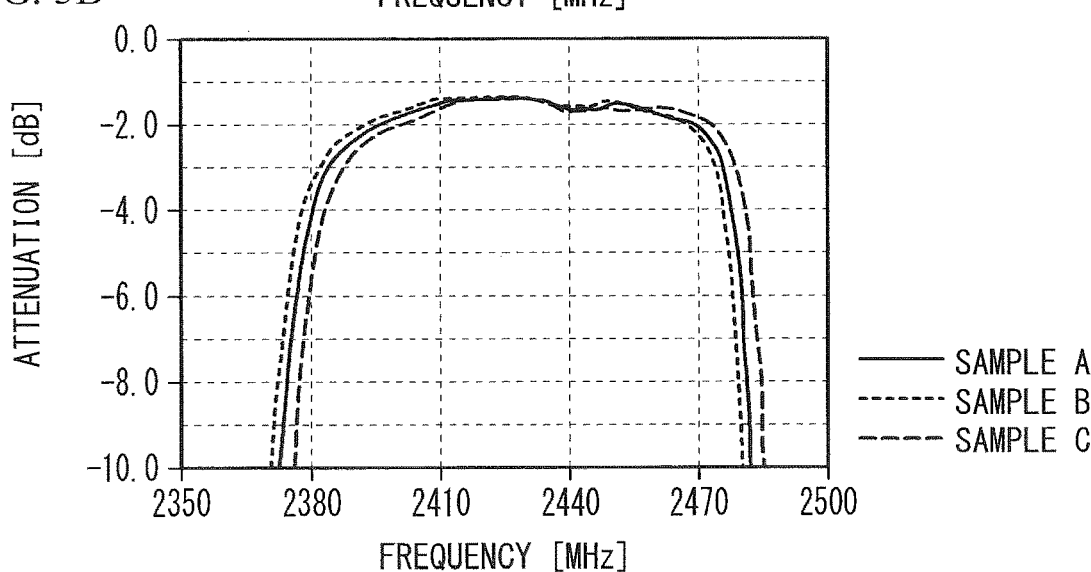
Figure 5C:
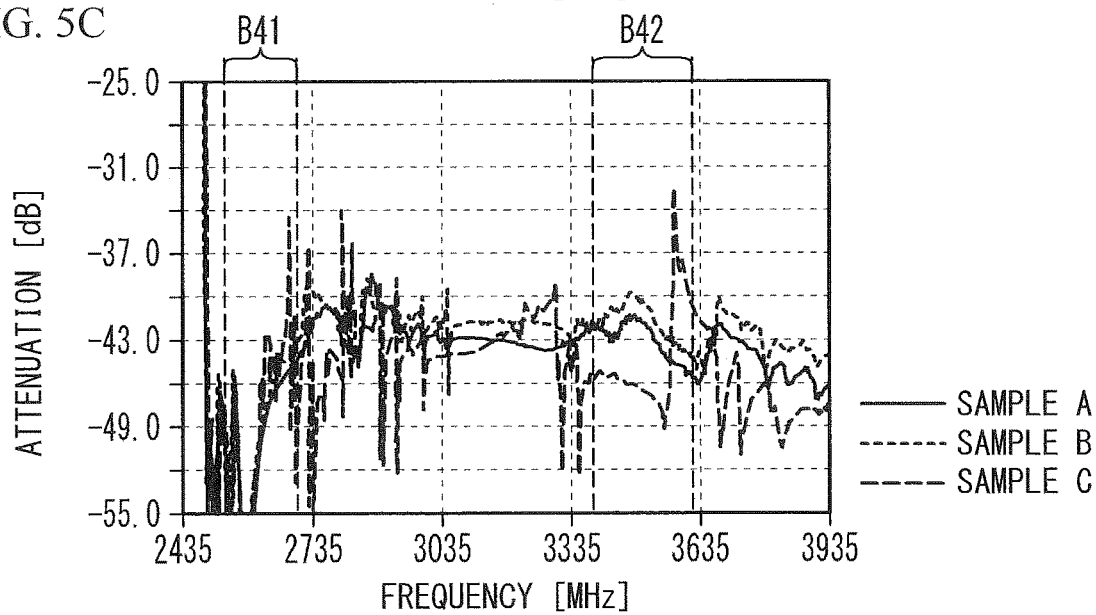

FIG. 5A through FIG. 5C illustrate the transmission characteristics of the ladder-type filters in the samples A through C. FIG. 5A illustrates the transmission characteristic in the wide band, FIG. 5B is an enlarged view around the passband, and FIG. 5C is an enlarged view around the stopband. As illustrated in FIG. 5A, the passband of the fabricated ladder-type filter is a 2.4 GHz band (2.4025 GHz to 2.4815 GHz), and the communication bands of long term evolution (LTE) Band41 and Band42 and the bands near the communication bands are defined as the stopband.

As illustrated in FIG. 5B, the loss in the passband is almost the same among the samples A through C. Although the passbands differ among the samples, this is because the resonant frequency and the antiresonant frequency of the acoustic wave resonator are not optimized in each sample. As illustrated in FIG. 5C, in the sample C, large spurious is formed around the communication bands of Band41 and Band42. In the sample B, spurious is smaller than spurious in the sample C. In the sample A, spurious is further smaller.

When the thickness T2 of the piezoelectric substrate 12 is configured to be equal to or less than the wavelength λ of the acoustic wave, spurious near the passband due to a bulk wave is reduced. However, spurious formed in the band higher than the passband in frequency is not sufficiently reduced. As illustrated in FIG. 5C, when the particle size of the polycrystalline substrate 10 is reduced, this spurious is reduced. This is considered because unnecessary waves such as bulk waves are scattered in the polycrystalline substrate 10.

First Variation of the First Embodiment

Figure 6A:
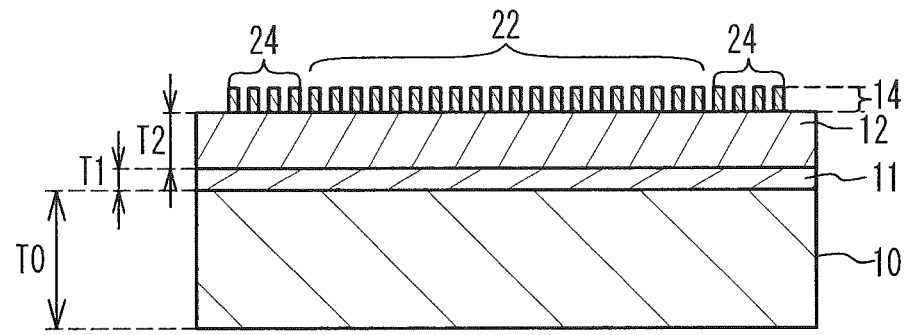
FIG. 6A through FIG. 6C are cross-sectional views of acoustic wave resonators in accordance with first through third variations of the first embodiment, respectively.

FIG. 6A is a cross-sectional view of an acoustic wave resonator in accordance with a first variation of the first embodiment. As illustrated in FIG. 6A, an intermediate layer 11 is located between the polycrystalline substrate 10 and the piezoelectric substrate 12. The intermediate layer 11 has a thickness T1. The intermediate layer 11 is an insulating layer such as, for example, a silicon oxide layer, a silicon nitride layer, an aluminum oxide layer, or an aluminum nitride layer. When the temperature coefficient of elastic modulus of the intermediate layer 11 is opposite in sign to the temperature coefficient of elastic modulus of the piezoelectric substrate 12, the intermediate layer 11 functions as a temperature compensation film. A silicon oxide film, which may contain additives such as fluorine, is used as the temperature compensation film. The intermediate layer 11 may function as a bonding layer that bonds the polycrystalline substrate 10 and the piezoelectric substrate 12. Other structures are the same as those of the first embodiment, and the description thereof is thus omitted.

Second Variation of the First Embodiment

Figure 6B:
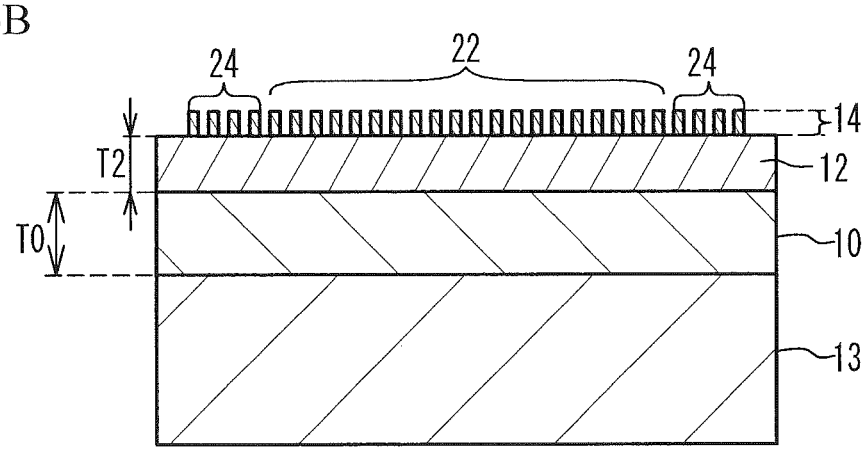

FIG. 6B is a cross-sectional view of an acoustic wave resonator in accordance with a second variation of the first embodiment. As illustrated in FIG. 6B, the lower surface of the polycrystalline substrate 10 is bonded on a support substrate 13. The support substrate 13 is, for example, a sapphire substrate, an alumina substrate, a quartz substrate, or a crystal substrate. Other structures are the same as those of the first embodiment, and the description thereof is thus omitted.

Third Variation of the First Embodiment

Figure 6C:
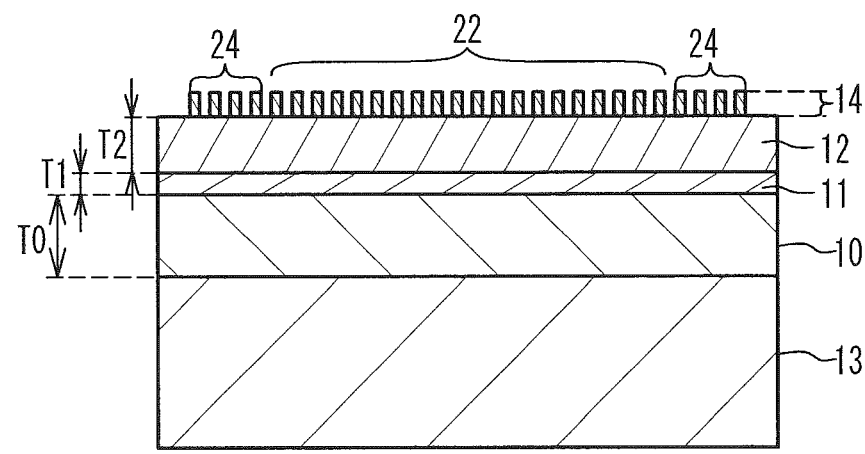

FIG. 6C is a cross-sectional view of an acoustic wave resonator in accordance with a third variation of the first embodiment. As illustrated in FIG. 6C, the lower surface of the polycrystalline substrate 10 is bonded on the support substrate 13. Other structures are the same as those of the first variation of the first embodiment, and the description thereof is thus omitted.

As in the first embodiment and the second variation thereof, the polycrystalline substrate 10 and the piezoelectric substrate 12 may be directly bonded, or as in the first and third variations of the first embodiment, the intermediate layer 11 may be located between the polycrystalline substrate 10 and the piezoelectric substrate 12. As in the second and third variations of the first embodiment, the polycrystalline substrate 10 may be bonded on the support substrate 13.

In the first embodiment and the variations thereof, the polycrystalline substrate 10 is located on the opposite side of the piezoelectric substrate 12 from the surface on which a pair of the comb-shaped electrodes 18 is located, and the average particle size is equal to or less than 66 times the average pitch of the electrode fingers 15 (i.e., 33λ or less). This configuration reduces spurious at frequencies higher than the passband as illustrated in FIG. 4A through FIG. 5C.

The average particle size of the polycrystalline substrate 10 is preferably equal to or less than 40 times the average pitch of the electrode fingers 15 (i.e., equal to or less than 20λ), more preferably equal to or less than 20 times the average pitch of the electrode fingers 15. This configuration further reduces spurious. To scatter unnecessary waves in the polycrystalline substrate 10, the average particle size is preferably equal to or greater than 1 time, more preferably equal to or greater than 2 times the average pitch of the electrode finger 15. The average pitch of the electrode finger 15 can be calculated by dividing the length of the acoustic wave resonator 20 in the X direction by the number of the electrode fingers 15. The average particle size of the polycrystalline substrate 10 can be calculated by the method described in FIG. 3. When the particle sizes of 20 or more crystal grains 50 are averaged, the more precise average particle size is obtained. When the particle sizes of 50 or more crystal grains 50 are averaged, the further precise average particle size is obtained.

The polycrystalline substrate 10 is a polycrystalline spinel substrate (i.e., a polycrystalline substrate mainly composed of $MgAl_2O_4$). This configuration further reduces spurious.

The term "mainly composed of a constituent element" means that the constituent element is contained so that the effect of the first embodiment and the variation thereof is achieved, impurities intentionally or unintentionally added are contained, and for example, 50 atomic % or greater or 80 atomic % or greater of the constituent element is contained.

The distance between the upper surface (the surface closer to the piezoelectric substrate 12) of the polycrystalline substrate 10 and the upper surface (the surface on which a pair of comb-shaped electrodes is located) of the piezoelectric substrate 12 (for example, T2 in the first embodiment and the second variation of the first embodiment, T2+T1 in the first and third variations of the first embodiment) is equal to or less than 4 times the average pitch of the electrode fingers 15. When T2 or T2+T1 is thinned as described above, spurious due to a bulk wave is reduced. However, as illustrated in FIG. 5C, the reduction in spurious at frequencies higher than the passband is insufficient. Thus, the average particle size of the polycrystalline substrate 10 is reduced. This configuration reduces spurious at frequencies higher than the passband. The distance between the upper surface of the polycrystalline substrate 10 and the upper surface of the piezoelectric substrate 12 is equal to or less than 2 times the average pitch of the electrode fingers 15, and is preferably equal to or greater than 0.2 times the average pitch of the electrode fingers 15.

The thickness T2 of the piezoelectric substrate 12 is preferably equal to or less than 2 times, more preferably equal to or less than 1.6 times the average pitch of the electrode fingers 15, and is preferably equal to or greater than 0.2 times the average pitch of the electrode fingers 15. This configuration reduces spurious due to a bulk wave. In addition, the loss is reduced.

When the piezoelectric substrate 12 is a 10° or greater and 50° or less rotated Y-cut X-propagation lithium tantalate substrate, the comb-shaped electrodes 18 mainly excite a shear horizontal (SH) wave. The piezoelectric substrate 12 is more preferably a 36° or greater and 42° or less rotated Y-cut X-propagation lithium tantalate substrate. The SH wave is a wave that oscillates in the direction parallel to the surface of the piezoelectric substrate 12 and perpendicular to the propagation direction of the SH wave. At this time, a bulk wave is likely to be excited. Thus, the use of the polycrystalline substrate 10 is preferable.

The thickness T2 of the polycrystalline substrate 10 is preferably equal to or greater than 2 times, more preferably equal to or greater than 4 times the average pitch of the electrode fingers 15. The thickness T2 is preferably equal to or greater than the average particle size, more preferably equal to or greater than 2 times the average particle size. This configuration scatters unnecessary waves, and thereby reduces spurious.

Second Embodiment

Figure 7A:
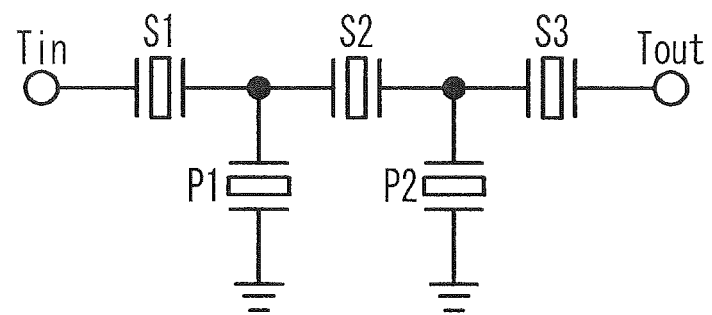
FIG. 7A is a circuit diagram of a filter in accordance with a second embodiment.

FIG. 7A is a circuit diagram of a filter in accordance with a second embodiment. As illustrated in FIG. 7A, one or more series resonators S1 through S3 are connected in series between an input terminal Tin and an output terminal Tout. One or more parallel resonators P1 and P2 are connected in parallel between the input terminal Tin and the output terminal Tout. At least one of the one or more series resonators S1 through S3 and the one or more parallel resonators P1 and P2 can be the acoustic wave resonator of the first embodiment. The number of resonators in the ladder-type filter is freely selected. The filter may be a multimode type filter.

First Variation of the Second Embodiment

Figure 7B:
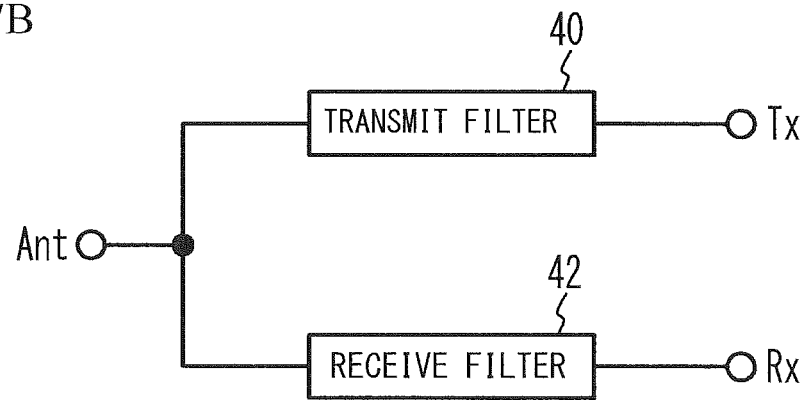
FIG. 7B is a circuit diagram of a duplexer in accordance with a first variation of the second embodiment.

FIG. 7B is a circuit diagram of a duplexer in accordance with a first variation of the second embodiment. As illustrated in FIG. 7B, a transmit filter 40 is connected between a common terminal Ant and a transmit terminal Tx. A receive filter 42 is connected between the common terminal Ant and a receive terminal Rx. The transmit filter 40 transmits, as transmission signals, signals in the transmit band to the common terminal Ant among high-frequency signals input from the transmit terminal Tx, and suppresses signals with other frequencies. The receive filter 42 transmits, as reception signals, signals in the receive band to the receive terminal Rx among high-frequency signals input from the common terminal Ant, and suppresses signals with other frequencies. At least one of the transmit filter 40 and the receive filter 42 can be the filter of the second embodiment.

A duplexer has been described as an example of the multiplexer, but the multiplexer may be a triplexer or a quadplexer.

Figure 8A:
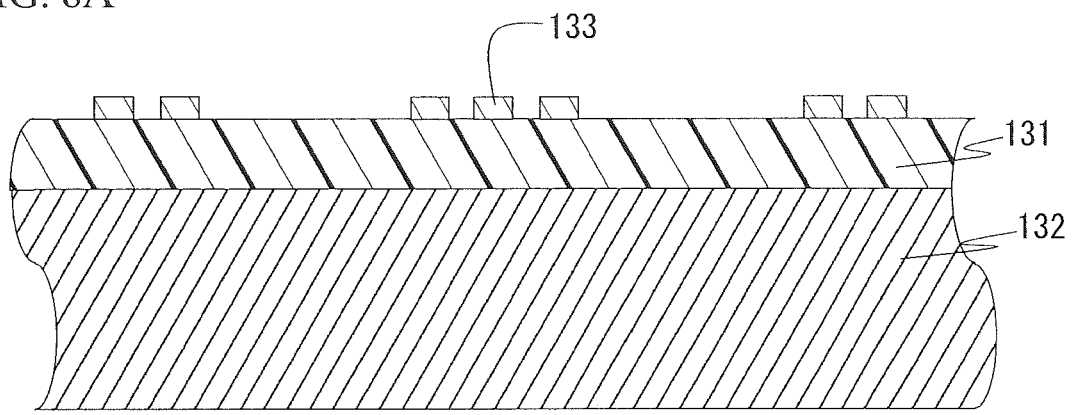
FIG. 8A through FIG. 8C are cross-sectional views illustrating a process of separating acoustic wave devices into individual acoustic wave devices in a comparative example.
Figure 8B:
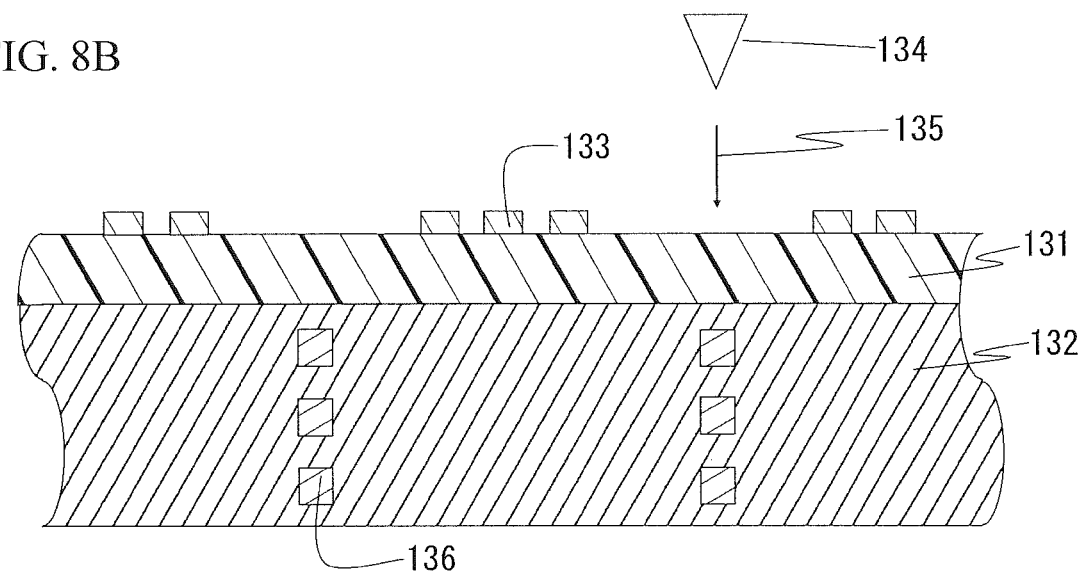
Figure 8C:
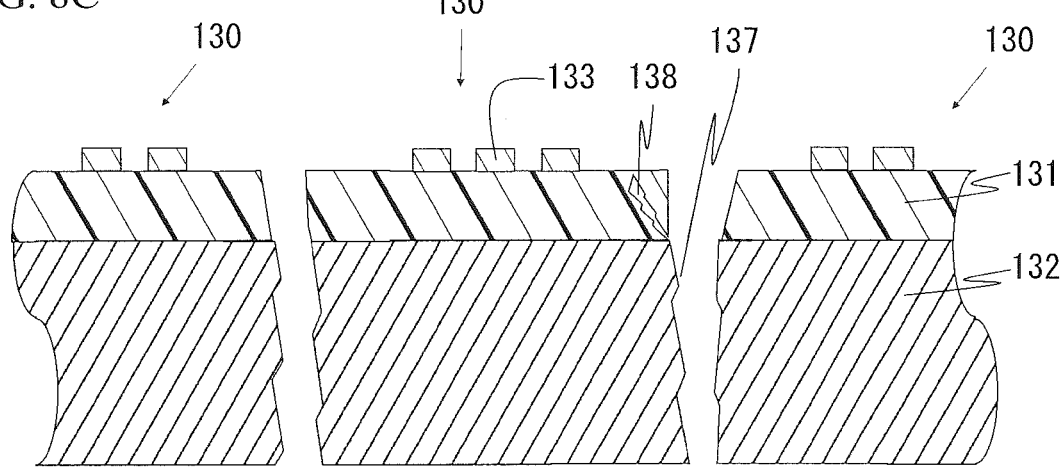

A description will be given of a technique for separating acoustic wave devices into individual acoustic wave devices as a comparative example. FIG. 8A through FIG. 8C are cross-sectional views illustrating a process of separating acoustic wave devices into individual acoustic wave devices in the comparative example.

As illustrated in FIG. 8A, a piezoelectric substrate 131 and a support substrate 132 are bonded. IDTs 133 are formed on the surface of the piezoelectric substrate 131. The piezoelectric substrate 131 is a lithium tantalate (LiTaO$_3$) wafer, and the support substrate 132 is a sapphire wafer.

As illustrated in FIG. 8B, a laser 135 is emitted from above the upper surface of the piezoelectric substrate 131 with use of a laser device 34. The laser 135 is emitted so that its focal point is positioned within the support substrate 132. Thus, the laser 135 passes through the piezoelectric substrate 131, and forms a plurality of regions 136 in the support substrate 132. The region 136 is a region in which the support substrate 132 was melt by the laser 135 and then solidified again.

As illustrated in FIG. 8C, a stress is applied to the piezoelectric substrate 131 and the support substrate 132 to split them. Through the above-described processes, acoustic wave devices 130 are separated into the individual acoustic wave devices 130. The acoustic wave device 130 is, for example, a surface acoustic wave (SAW) device. However, when the support substrate 132 is a polycrystalline substrate, since crystal grains are irregularly arranged, a surface 137 that separates the acoustic wave devices 130 does not crack straight, and chipping of the support substrate 132 and diagonal cracking of the piezoelectric substrate 131 are likely to occur. In addition, when a stress is applied to the piezoelectric substrate 131 and the support substrate 132 at the time of split, a crack 138 may be formed from the point where the bonded interface between the piezoelectric substrate 131 and the support substrate 132 and the surface 137 intersect.

Third Embodiment

Hereinafter, a description will be given of a third embodiment.

Figure 9A:
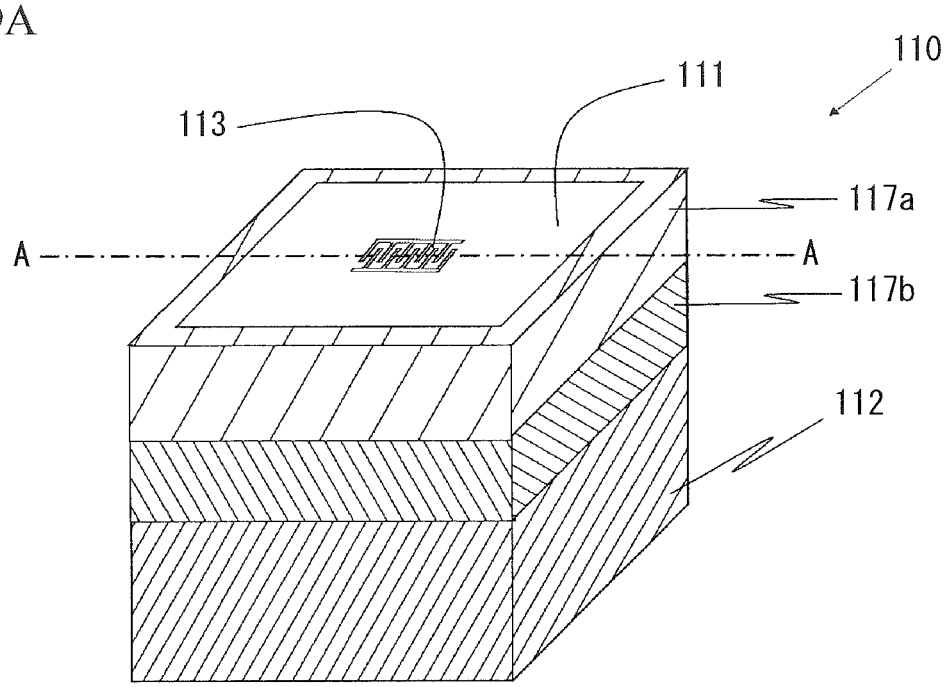
FIG. 9A is a perspective view of an acoustic wave device in accordance with a third embodiment.
Figure 9B:
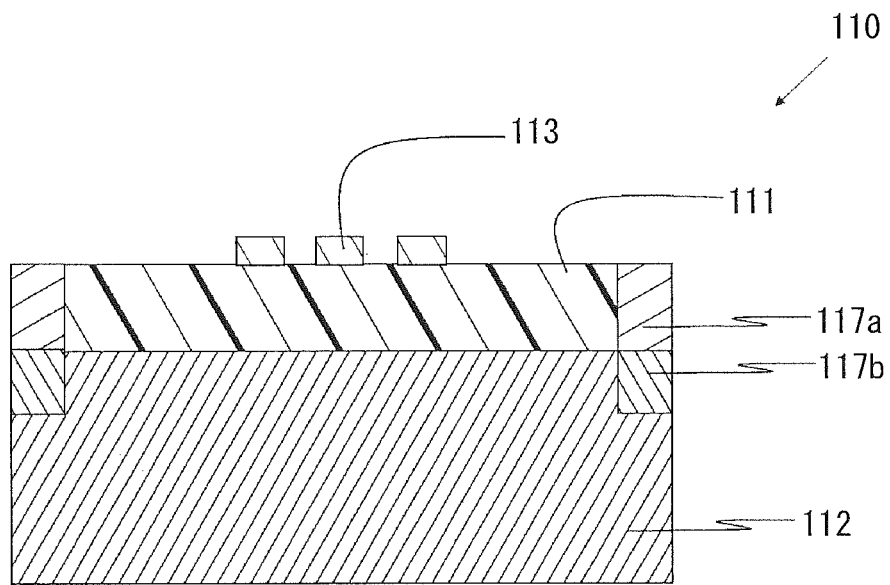
FIG. 9B is a cross-sectional view taken along line A-A in FIG. 9A.

FIG. 9A is a perspective view of an acoustic wave device 110 in accordance with the third embodiment, and FIG. 9B is a cross-sectional view taken along line A-A in FIG. 9A. The acoustic wave device 110 is, for example, a SAW device used in a filter. As illustrated in FIG. 9A and FIG. 9B, in the structure of the acoustic wave device 110, an IDT 113 is formed on a piezoelectric substrate 111. A support substrate 112 is bonded on the opposite surface of the piezoelectric substrate 111 from the surface on which the IDT 113 is formed. A first region 117a having a crystal structure different from the crystal structure of the piezoelectric substrate 111 is formed in the side portions of the piezoelectric substrate 111. A second region 117b having a crystal structure different from the crystal structure of the support substrate 112 is formed in the upper parts (the parts closer to the piezoelectric substrate 111) of the side portions of the support substrate 112. The region 117a overlaps with the region 117b. The region 117a and the region 117b are the regions in which the piezoelectric substrate 111 and the support substrate 112 melted, and then solidified again and were amorphized.

The material and the dimensions of each component of the acoustic wave device 110 will be described. The piezoelectric substrate 111 is mainly made of, for example, lithium tantalate (LiTaO$_3$) or lithium niobate (LiNbO$_3$). The thickness of the piezoelectric substrate 111 is 1.0 µm to 5.0 µm, and is preferably equal to or less than the wavelength λ of the surface acoustic wave generated in the acoustic wave device 110. When the acoustic wave device 110 is used as a filter for 2.4 GHz band, λ=1.6 µm. The support substrate 112 is a polycrystalline substrate mainly made of, for example, polycrystalline spinel or polycrystalline silicon. The support substrate 112 has a thickness of, for example, 50 µm to 500 µm. The widths of the regions 117a and the region 117b as viewed from above the upper surface of the piezoelectric substrate 111 are 8 µm. The IDT 113 is made of, for example, aluminum (Al), copper (Cu), or an Al—Cu alloy. Grating reflectors may be provided so as to sandwich the IDT 113.

When the amorphized region 117a and the amorphized region 117b are provided in the edge part of the bonded interface between the piezoelectric substrate 111 and the support substrate 112 of the acoustic wave device 110, it is expected that the mechanical strength of the edge part of the bonded interface increases, thereby, making it difficult for the piezoelectric substrate 111 and the support substrate 112 to peel. The amorphized region 117a reaches the surface of the piezoelectric substrate 111. Thus, even when a microcrack is formed in the end portion of the piezoelectric substrate 111, the piezoelectric substrate 111 is inhibited from being broken along the cleavage direction from the microcrack because the amorphous structure does not have a cleavage direction.

FIG. 10A through FIG. 10C, FIG. 11A through FIG. 11C, and FIG. 12A and FIG. 12B are cross-sectional views illustrating a method of fabricating the acoustic wave device in accordance with the third embodiment.

Figure 10A:
FIG. 10A through FIG. 10C are cross-sectional views (No. 1) illustrating a method of fabricating the acoustic wave device in accordance with the third embodiment.

As illustrated in FIG. 10A, the piezoelectric substrate 111 and the support substrate 112 are prepared. The piezoelectric substrate 111 is a LiTaO$_3$ wafer, and the support substrate 112 is a polycrystalline spinel wafer.

Figure 10B:
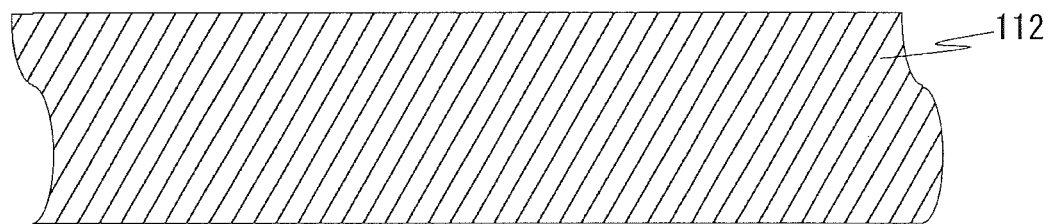

Then, as illustrated in FIG. 10B, the piezoelectric substrate 111 and the support substrate 112 are bonded to each other. Examples of the boding method include, but are not limited to, the method described in Patent Document 1.

Figure 10C:
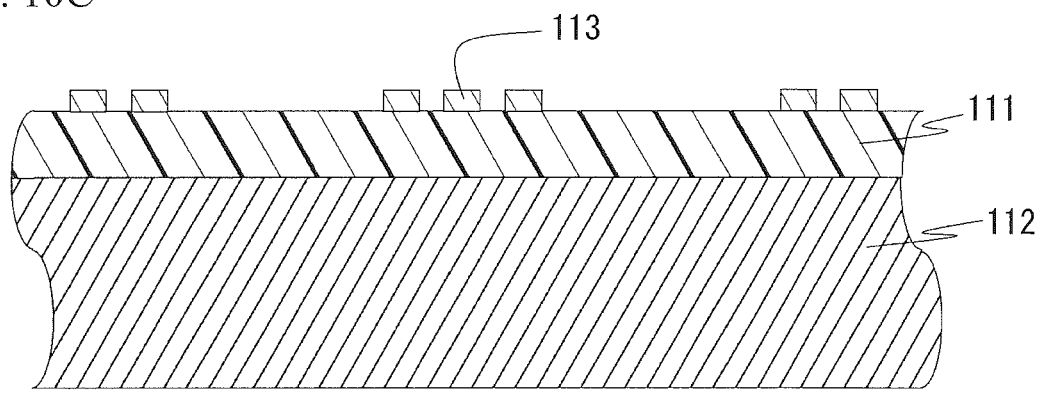

Then, as illustrated in FIG. 10C, the IDTs 113 are formed on the piezoelectric substrate 111. The IDTs 113 are formed by sputtering or evaporation, and are patterned by photolithography.

Figure 11A:
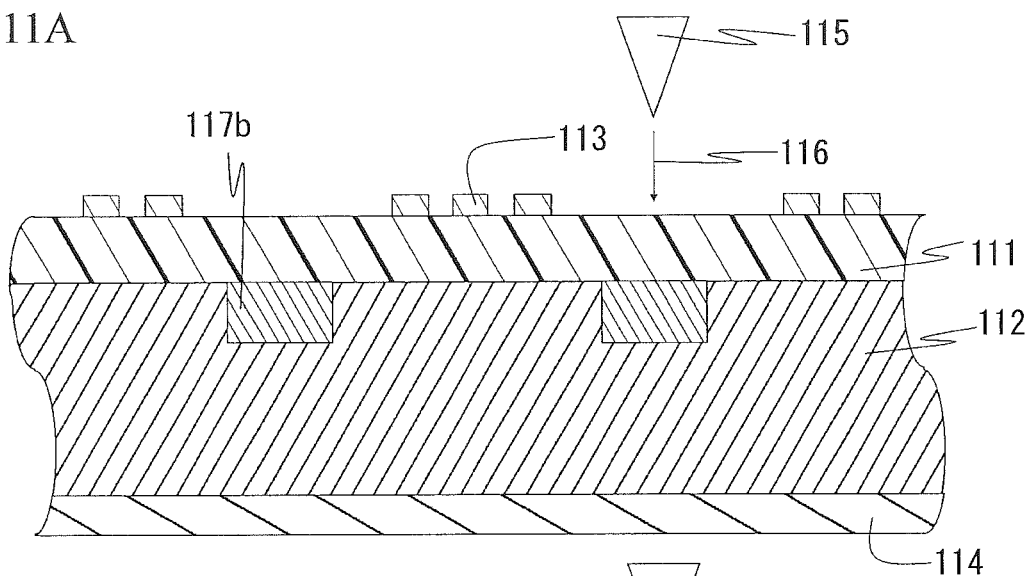
FIG. 11A through FIG. 11C are cross-sectional views (No. 2) illustrating the method of fabricating the acoustic wave device in accordance with the third embodiment.

Then, as illustrated in FIG. 11A, a protection tape 114 is attached to the lower surface of the support substrate 112. A laser 116 is emitted from the piezoelectric substrate 111 side with use of a laser device 115, passes through the piezoelectric substrate 111, and forms the second region 117b in the support substrate 112. The depth, i.e., the width in the vertical direction of the paper surface, of the region 117b is approximately equal to that of the piezoelectric substrate 111, and is 1.0 μm to 5.0 μm. The region 117b does not reach the lower surface of the support substrate 112. The width in the horizontal direction of the paper surface of the region 117b is 26 μm. The laser 116 is, for example, a neodymium (Nd):YAG laser. The output of the laser 116 is preferably 0.8 W. The spot diameter of the laser 116 is 26 μm.

Figure 11B:
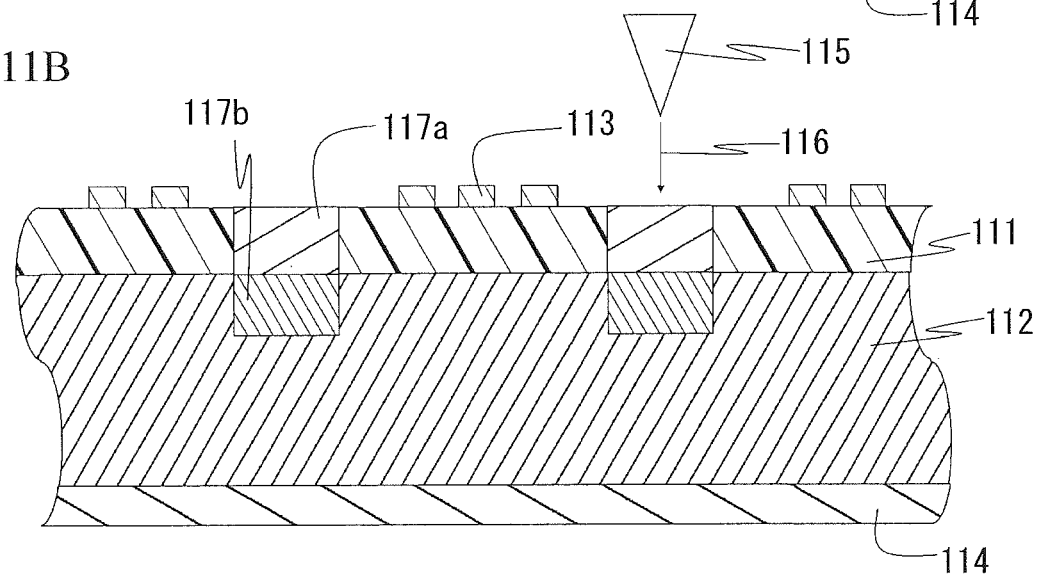

Then, as illustrated in FIG. 11B, the laser 116 is emitted to the piezoelectric substrate 111 with use of the laser device 115 to form the first region 117a in the piezoelectric substrate 111. The region 117a reaches the bonded interface with the support substrate 112 from the surface of the piezoelectric substrate 111. The width in the vertical direction of the paper surface of the region 117a is equal to the thickness of the piezoelectric substrate 111, and is 1.0 μm to 5.0 μm. The width in the horizontal direction of the paper surface of the region 117a is 26 μm, which is equal to that of the region 117b. The region 117a and the region 117b are continuously formed from the surface to the back of the paper.

Figure 11C:
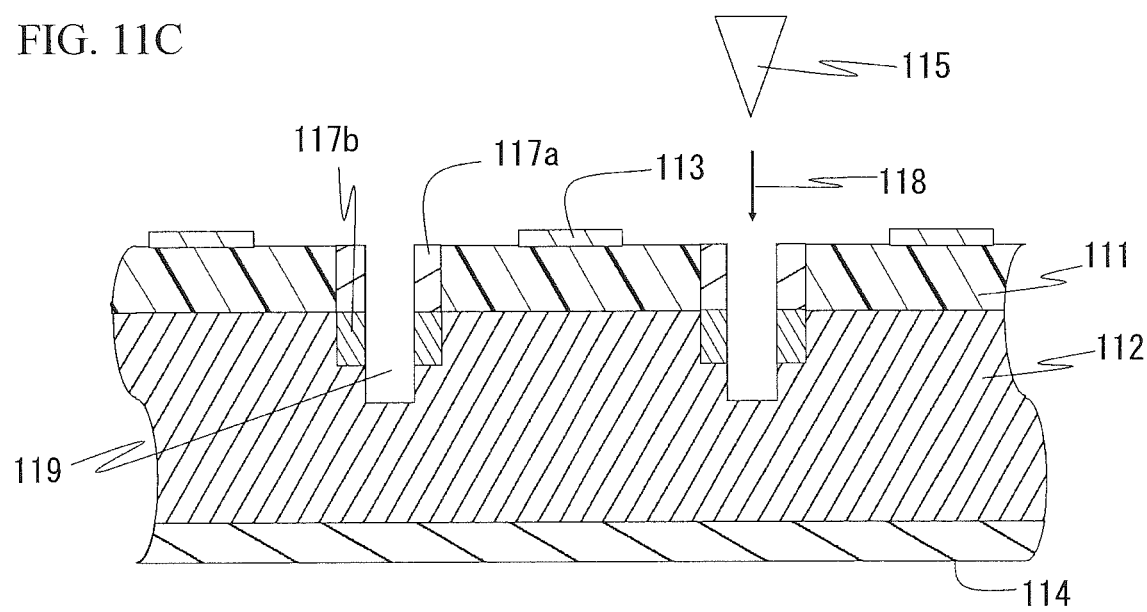

Then, as illustrated in FIG. 11C, a laser 118 is emitted from the laser device 115. A part of the region 117a, a part of the region 117b, and a part of the support substrate 112 are removed by laser ablation with use of the laser 118 to form a groove 119 in the support substrate 112. The laser 118 is, for example, a Nd:YAG laser. The output of the laser 118 is preferably stronger than the output of the laser 116 presented in FIG. 11B, and is preferably 1.2 W. The spot diameter of the laser 118 is 10 μm. The width in the horizontal direction of the paper surface of the groove 119 is 10 μm. The depth of the groove 119 from the bonded interface between the support substrate 112 and the piezoelectric substrate 111 is approximately one-tenth of the thickness of the support substrate 112, and is preferably greater than the depth of the second region. The groove 119 may have a tapered shape in which the width of the side wall of the groove 119 decreases as the position in the thickness direction of the support substrate 112 becomes deeper. Although the description is omitted in the above figure for the convenience sake, when the groove 119 is formed with use of a laser, the side wall and the bottom of the groove 119 are also amorphized.

Figure 12A:
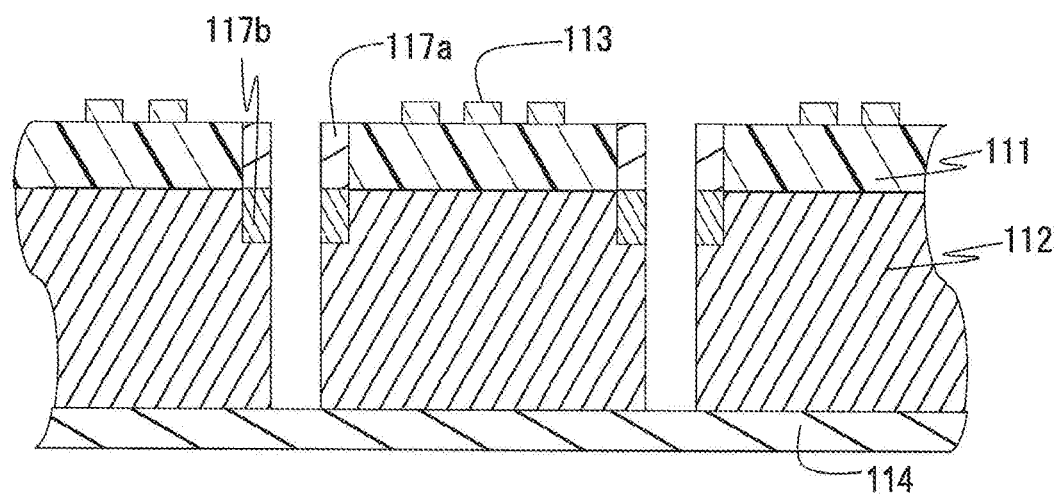
FIG. 12A and FIG. 12B are cross-sectional views (No. 3) illustrating the method of fabricating the acoustic wave device in accordance with the third embodiment.

Then, as illustrated in FIG. 12A, the piezoelectric substrate 111 and the support substrate 112 are split along the groove 119 formed in FIG. 11C. Examples of the splitting method include, but are not limited to, a chocolate break method in which a bending stress is applied to the piezoelectric substrate 111 and the support substrate 112 from the groove 119 as a starting point to split the support substrate 112, and a tape expand method in which the protection tape 114 is expanded to apply a stress to the support substrate 112. At this time, since the region 117a and the region 117b have homogeneous structures, the mechanical strength is strong, and the formation of cracks and chipping are inhibited. Furthermore, since the groove 119 is formed in the support substrate 112, it is easy to split the support substrate 112 straight, and thus, chipping is inhibited.

Figure 12B:
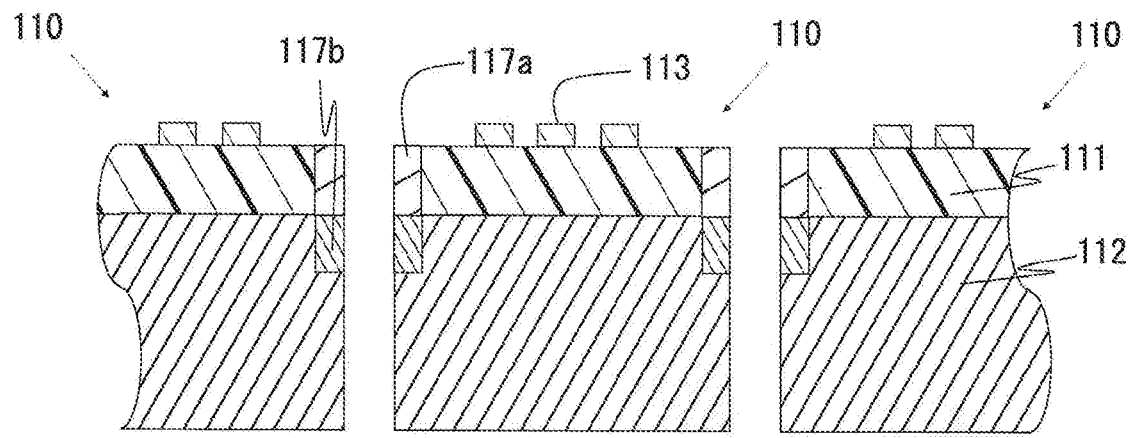

Through the above processes, as illustrated in FIG. 12B, the wafer is separated into the individual acoustic wave devices 110.

Variation of the Third Embodiment

FIG. 13A through FIG. 13C, FIG. 14A through FIG. 14C, and FIG. 15 are cross-sectional views illustrating another method of fabricating the acoustic wave device in accordance with the third embodiment.

The process in which the piezoelectric substrate 111 and the support substrate 112 are bonded, and the process in which the IDTs 113 are formed on the piezoelectric substrate 111 are the same as those illustrated in FIG. 11A thorough FIG. 11C of the third embodiment, and the description thereof is thus omitted.

Figure 13A:
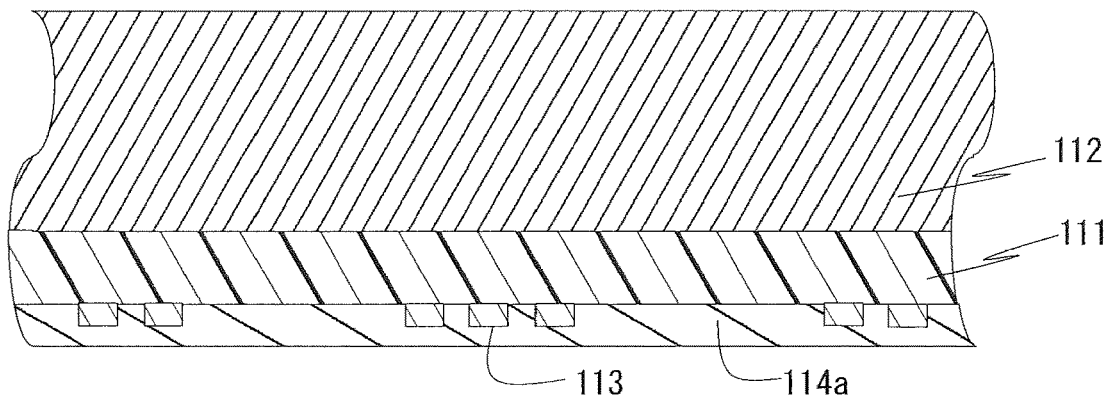
FIG. 13A through FIG. 13C are cross-sectional views (No. 1) illustrating another method of fabricating the acoustic wave device in accordance with the third embodiment.

As illustrated in FIG. 13A, a protection tape 114a is attached onto the piezoelectric substrate 111 and the IDTs 113.

Figure 13B:
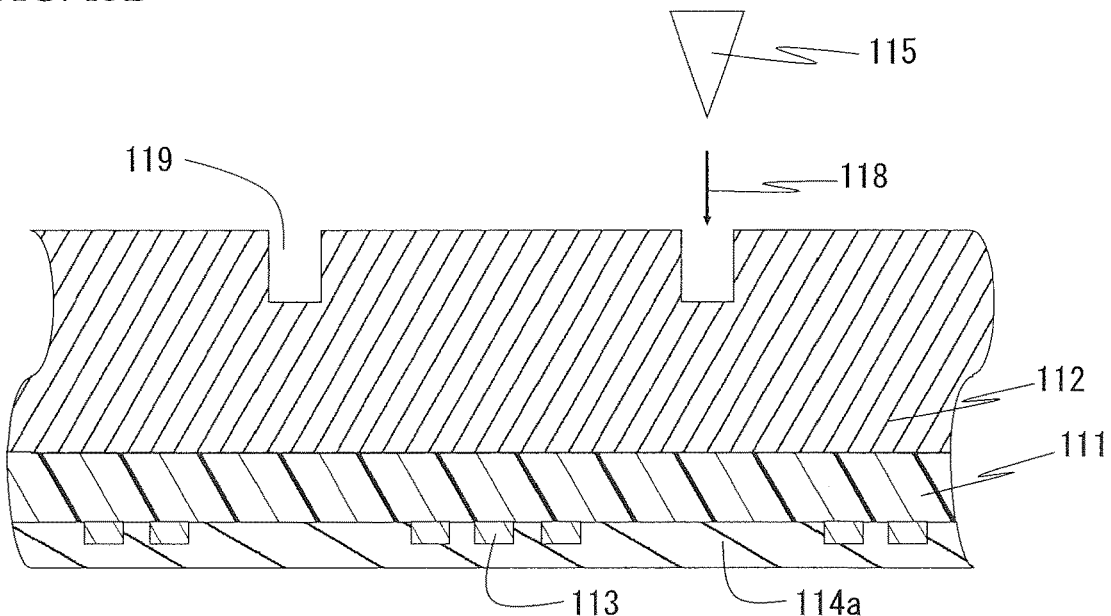

Then, as illustrated in FIG. 13B, the laser 118 is emitted from the laser device 115 to the support substrate 112. This process removes a part of the support substrate 112, and forms the groove 119. The width of the groove 119 in the horizontal direction of the paper surface is 10 μm. The shape of the groove 119 may be a tapered shape in which the side wall of the groove 119 decreases as the position in the thickness direction of the support substrate 112 becomes deeper.

Figure 13C:
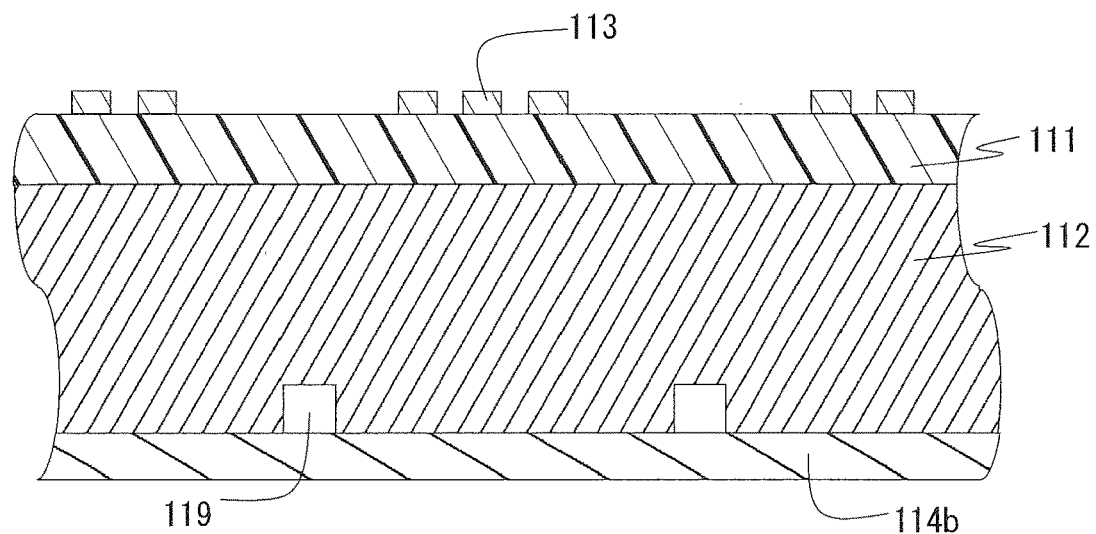

As illustrated in FIG. 13C, the protection tape 114a is peeled from the piezoelectric substrate 111 and the IDTs 113. A protection tape 114b is attached to the surface on which the groove 119 is formed of the support substrate 112.

Figure 14A:
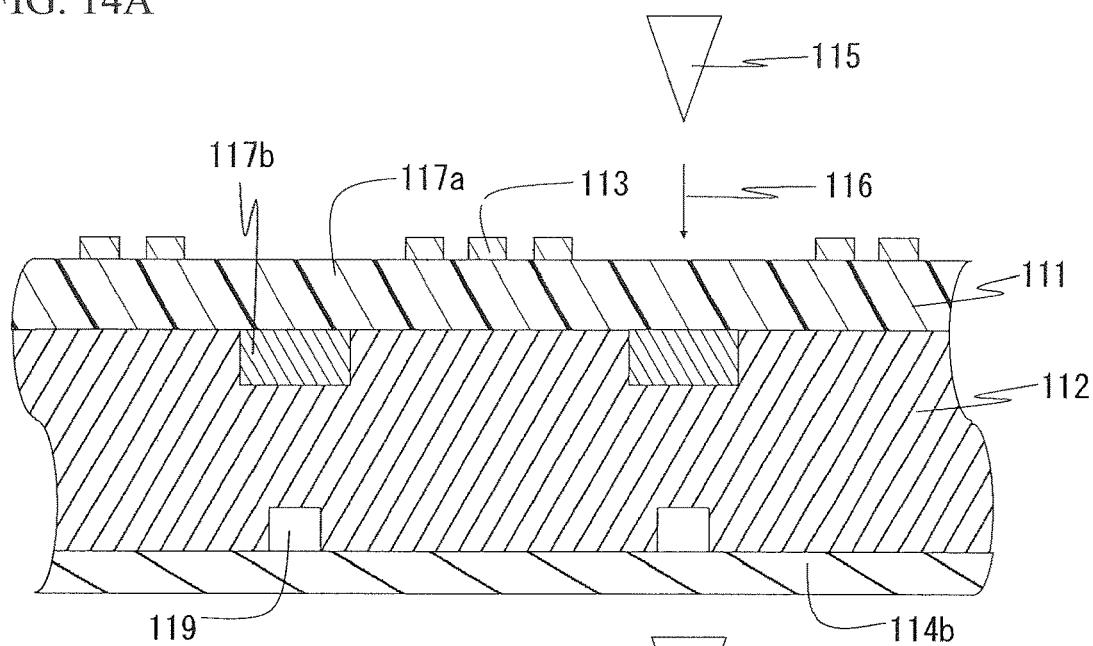
FIG. 14A through FIG. 14C are cross-sectional views (No. 2) illustrating the another method of fabricating the acoustic wave device in accordance with the third embodiment.

As illustrated in FIG. 14A, the laser 116 is emitted from the laser device 115 to the support substrate 112. The laser 116 forms the region 117b in the support substrate 112.

Figure 14B:
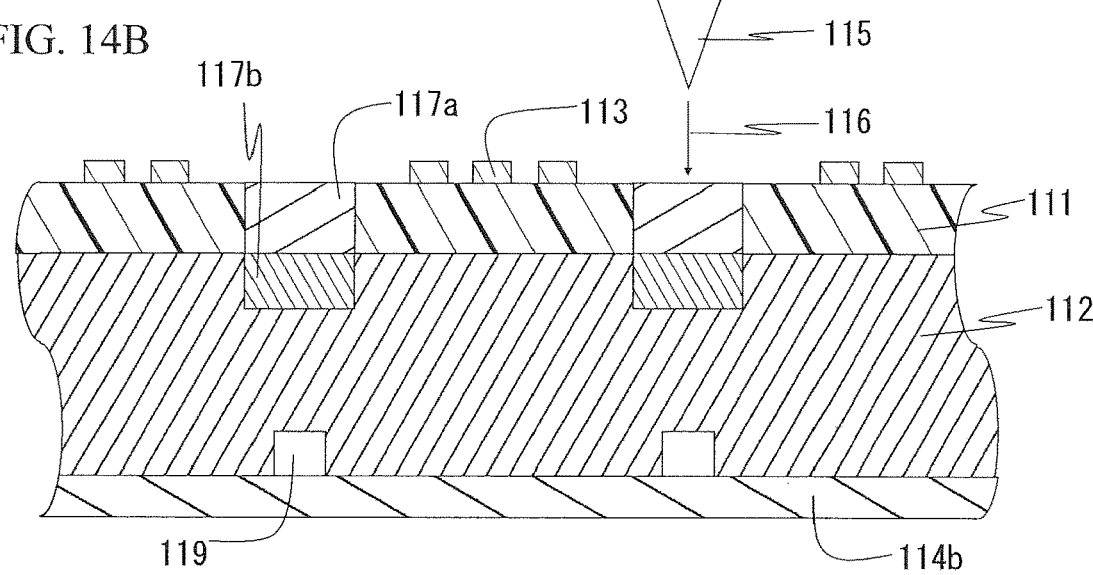

As illustrated in FIG. 14B, the laser 116 is emitted from the laser device 115 to the piezoelectric substrate 111. The laser 116 forms the region 117a in the piezoelectric substrate 111.

Figure 14C:
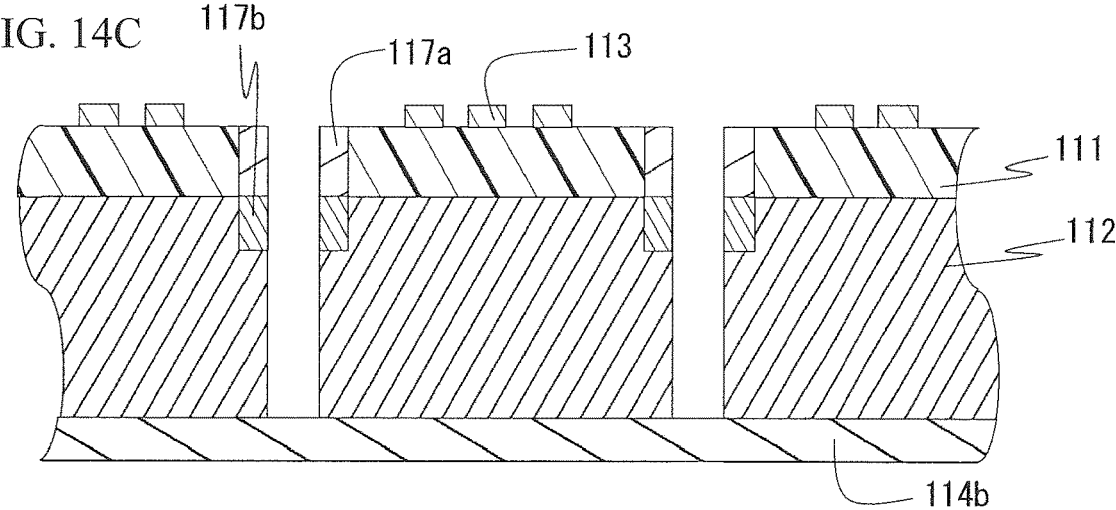

Then, as illustrated in FIG. 14C, a stress is applied to the piezoelectric substrate 111 and the support substrate 112 to split the piezoelectric substrate 111 and the support substrate 112. The splitting method is a chocolate break method in which the piezoelectric substrate 111 and the support substrate 112 are split by applying a stress to the groove 119 or a tape expand method in which the protection tape 114b is expanded.

Figure 15:
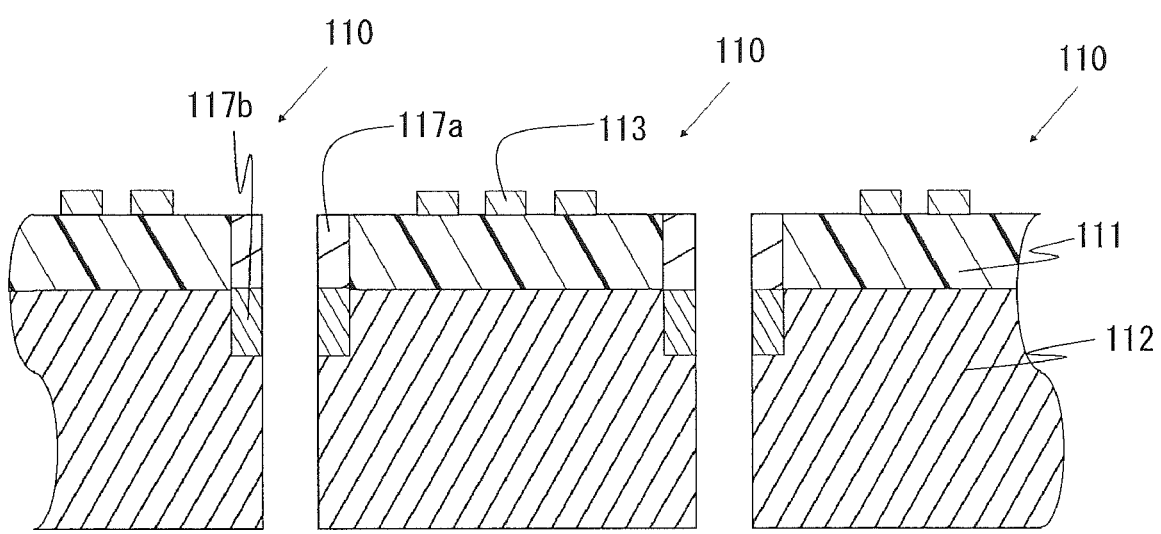
FIG. 15 is a cross-sectional view (No. 3) illustrating the another method of fabricating the acoustic wave device in accordance with the third embodiment.

Through the above described processes, as illustrated in FIG. 15, the acoustic wave devices 110 are separated into the individual acoustic wave devices 110.

In the fabrication method of the acoustic wave device 110 in accordance with the variation of the third embodiment, the number of times the laser is emitted to the piezoelectric substrate 111 is reduced, compared with that of the third embodiment, and the breakage of the piezoelectric substrate 111 is thus reduced.

Fourth Embodiment

Hereinafter, an acoustic wave device in accordance with a fourth embodiment will be described. The dimensions and the material of the element to which the same reference symbol as the third embodiment is affixed are the same as those described in the third embodiment, and the description thereof is thus omitted.

Figure 16A:
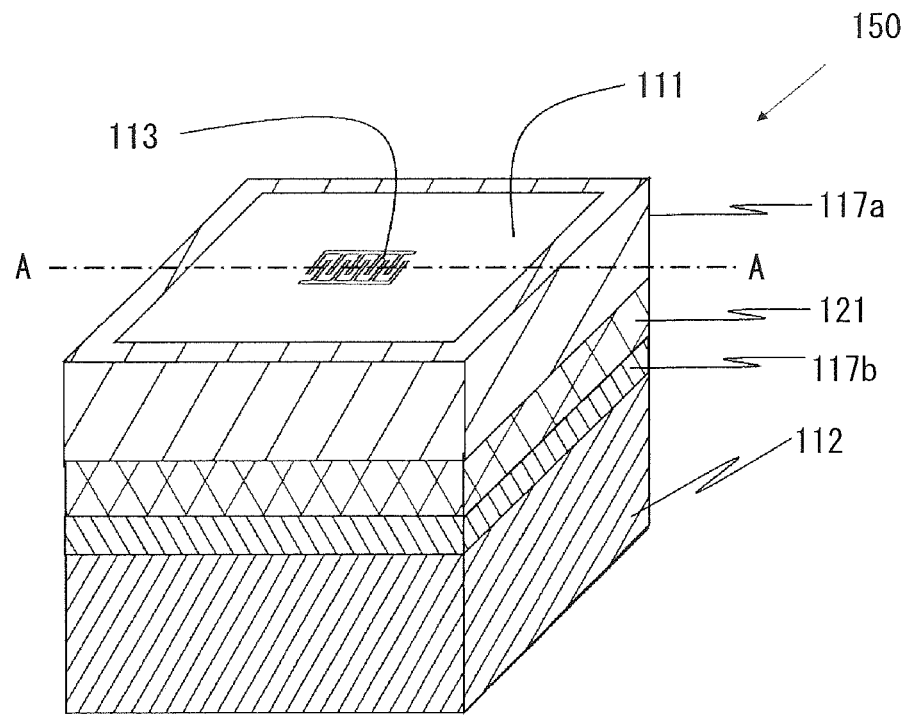
FIG. 16A is a perspective view of an acoustic wave device in accordance with a fourth embodiment.
Figure 16B:
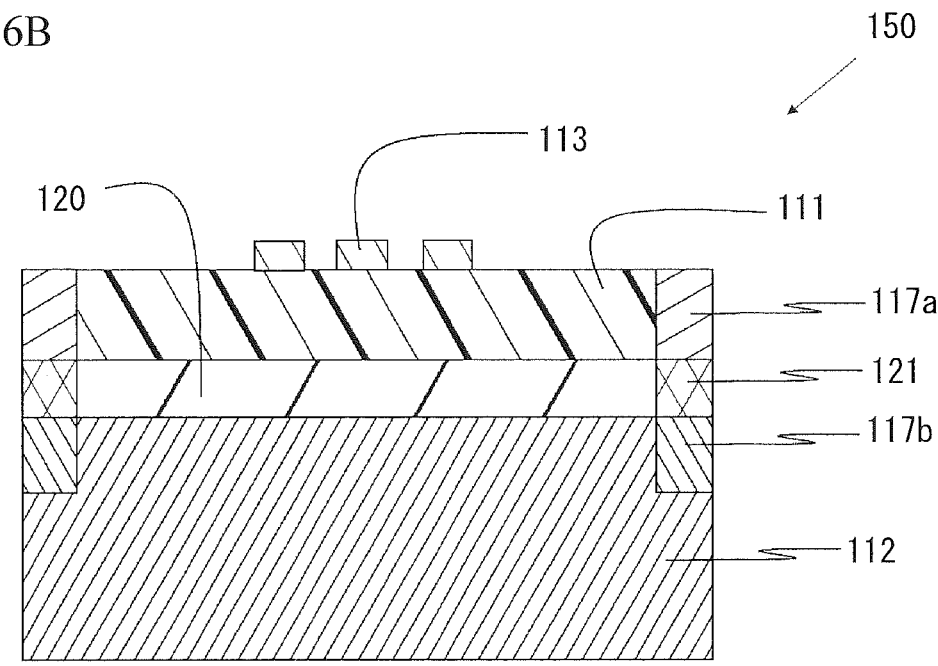
FIG. 16B is a cross-sectional view taken along line A-A in FIG. 16A.

FIG. 16A is a perspective view illustrating the acoustic wave device in accordance with the fourth embodiment, and FIG. 16B is a cross-sectional view taken along line A-A in FIG. 16A. As illustrated in FIG. 16A and FIG. 16B, the piezoelectric substrate 111 and the support substrate 112 are bonded through a thin film layer 120. The thin film layer 120 is made of a silicon compound such as, for example, silicon dioxide ($SiO_2$) or aluminum nitride (AlN), and preferably has a thickness of 0.1 μm to 5.0 μm. The IDT 113 is formed on the piezoelectric substrate 111. The first region 117a is formed in the side portions, which include the periphery of the upper surface of the piezoelectric substrate 111 and the side surfaces of the piezoelectric substrate 111, of the piezoelectric substrate 111. The second region 117b is formed in parts of the upper parts of the side portions of the support substrate 112. An altered region 121 is formed in the side portions of the thin film layer 120.

Compared with the third embodiment, an acoustic wave device 150 of the fourth embodiment has a structure in which the piezoelectric substrate 111 and the support substrate 112 are bonded through the thin film layer 120. When the thin film layer 120 is made of $SiO_2$, the absolute value of the temperature coefficient of frequency can be reduced, and the improvement in temperature characteristic is expected.

Figure 17A:
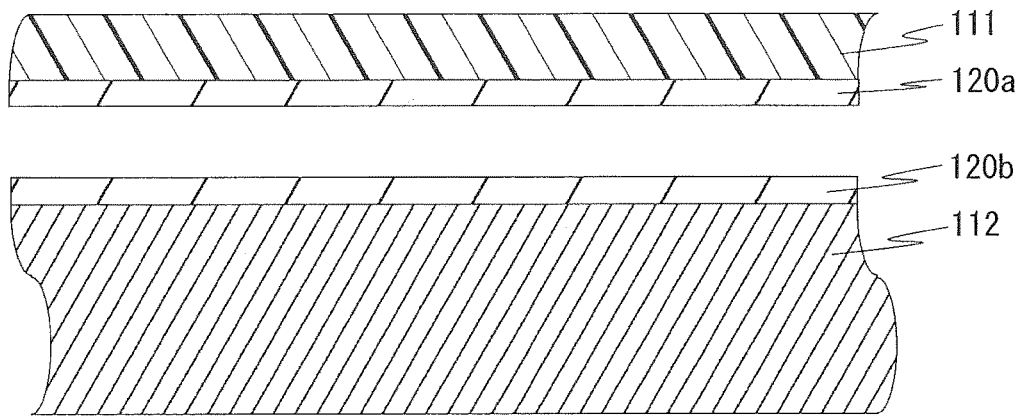
FIG. 17A through FIG. 17C are cross-sectional views (No. 1) illustrating a method of fabricating the acoustic wave device in accordance with the fourth embodiment.
Figure 17B:
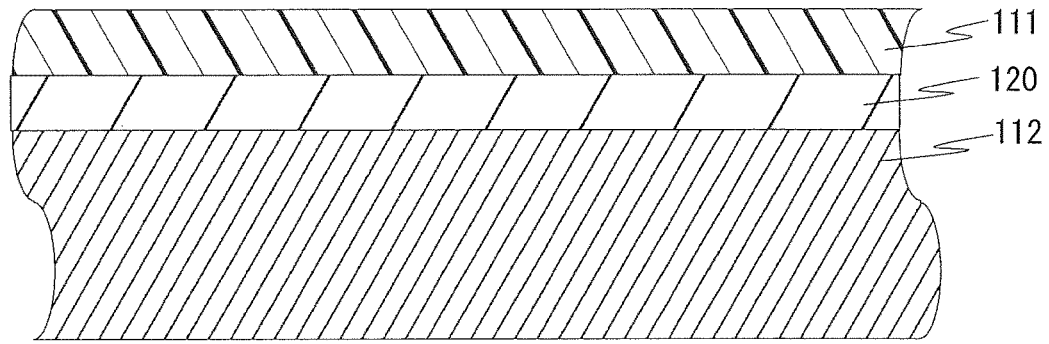
Figure 17C:
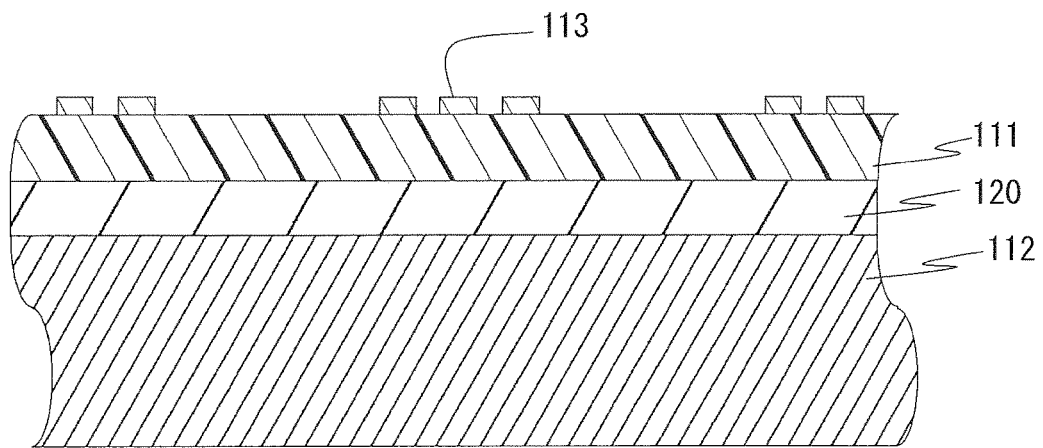

FIG. 17A through FIG. 17C are cross-sectional views illustrating a method of fabricating the acoustic wave device in accordance with the fourth embodiment. As illustrated in FIG. 17A, a thin film layer 120a is formed on the piezoelectric substrate 111, and a thin film layer 120b is formed on the support substrate 112. The formation method is, for example, sputtering. The thin film layer 120a and the thin film layer 120b have thicknesses of 0.05 μm to 2.5 μm.

As illustrated in FIG. 17B, the surface, on which the thin film layer 120a is formed, of the piezoelectric substrate 111 and the surface, on which the thin film layer 120b is formed, of the support substrate 112 are bonded. When the thin film layer 120a and the thin film layer 120b are bonded, the thin film layer 120 is formed.

As illustrated in FIG. 17C, the IDTs 113 are formed on the piezoelectric substrate 111. The IDTs 113 are formed by sputtering, evaporation, or the like, and are patterned by photolithography.

Figure 18A:
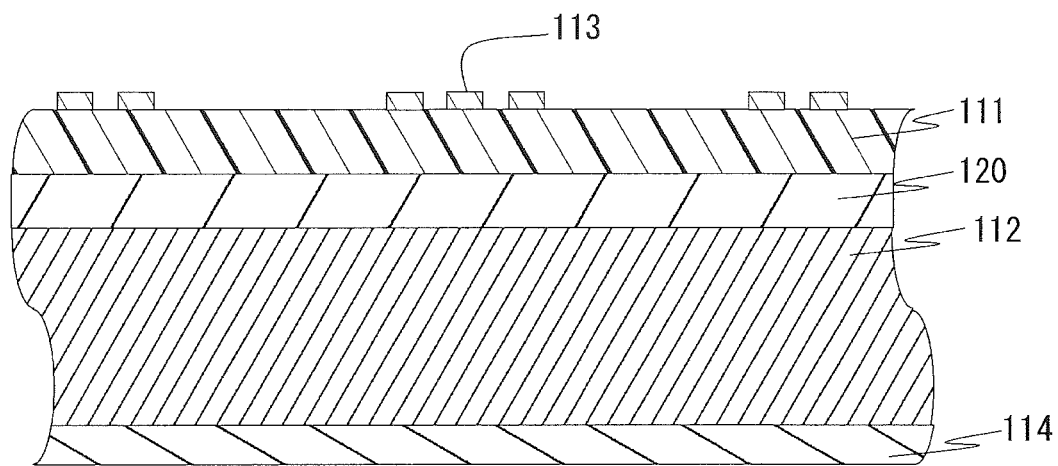
FIG. 18A and FIG. 18B are cross-sectional views (No. 2) illustrating the method of fabricating the acoustic wave device in accordance with the fourth embodiment.

As illustrated in FIG. 18A, the protection tape 114 is attached to the support substrate 112.

Figure 18B:
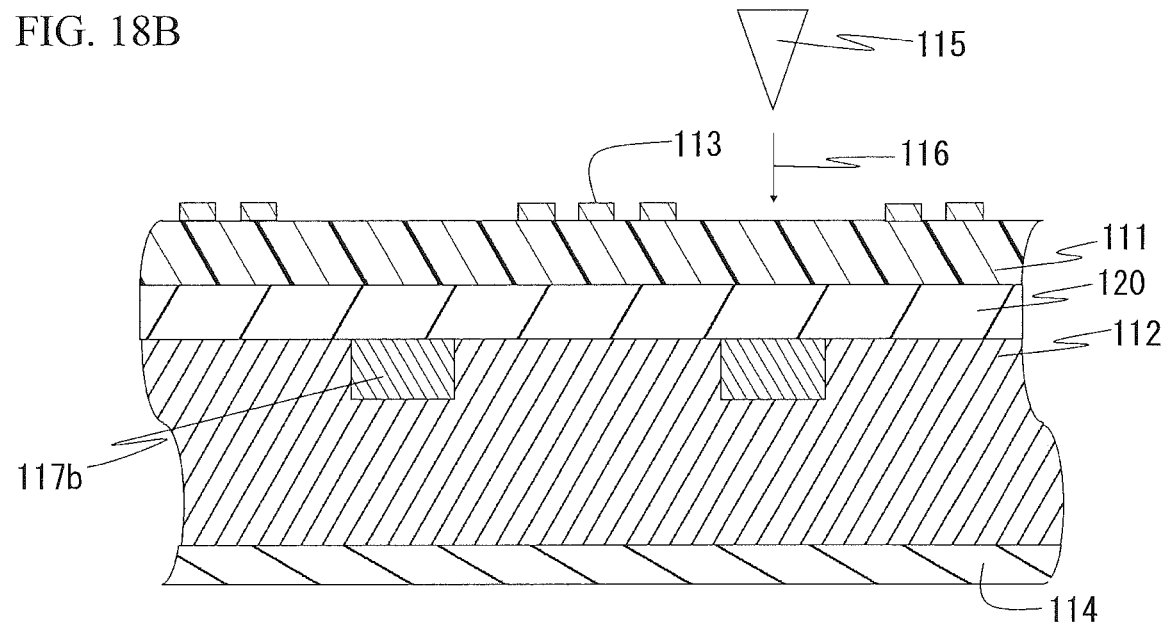

As illustrated in FIG. 18B, the laser 116 is emitted from above the upper surface of the piezoelectric substrate 111 with use of the laser device 115 to form the region 117b in the support substrate 112.

Figure 19A:
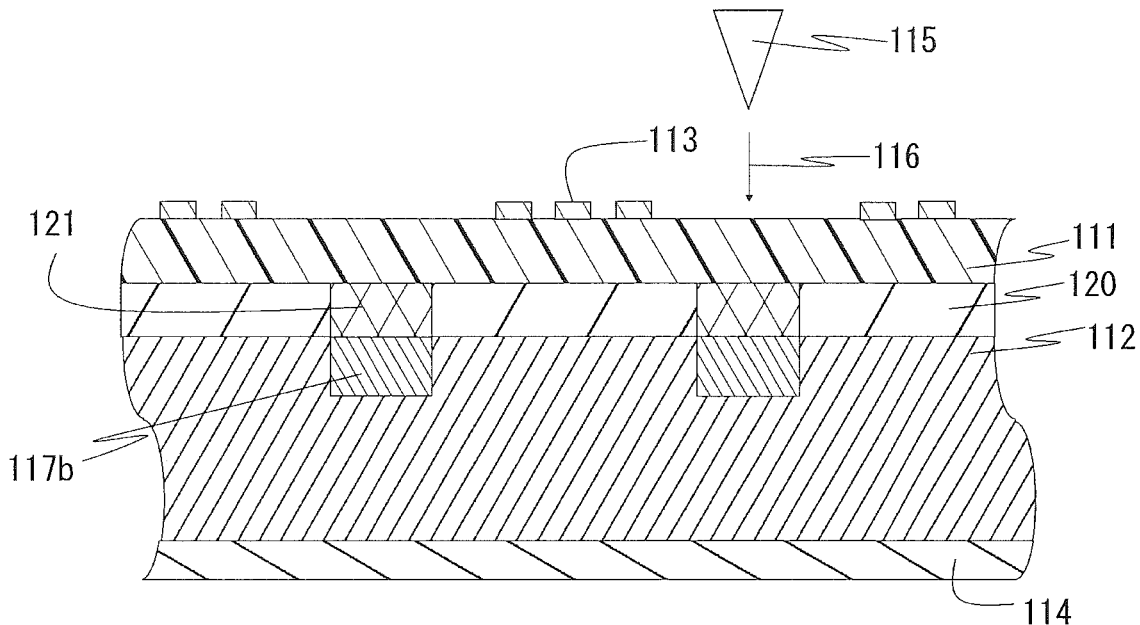
FIG. 19A and FIG. 19B are cross-sectional views (No. 3) illustrating the method of fabricating the acoustic wave device in accordance with the fourth embodiment.

As illustrated FIG. 19A, the laser 116 is emitted to the thin film layer 120 to form the altered region 121 in the thin film layer 120. The altered region 121 is a region where the thin film layer 120 was melt by the laser 116 and solidified again. The width of the altered region 121 in the vertical direction of the paper surface is equal to the thickness of the thin film layer 120, and is 0.1 μm to 5.0 μm. The width of the altered region 121 in the horizontal direction of the paper surface is 26 μm.

Figure 19B:
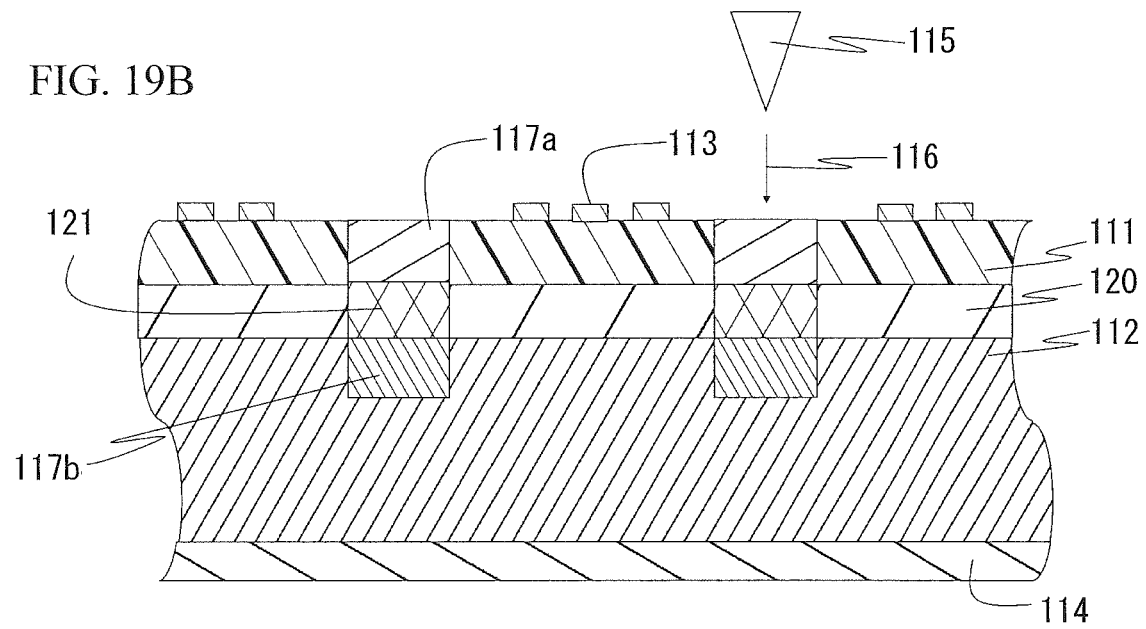

As illustrated in FIG. 19B, the laser 116 is emitted to the piezoelectric substrate 111 to form the region 117a in the piezoelectric substrate 111.

Figure 20A:
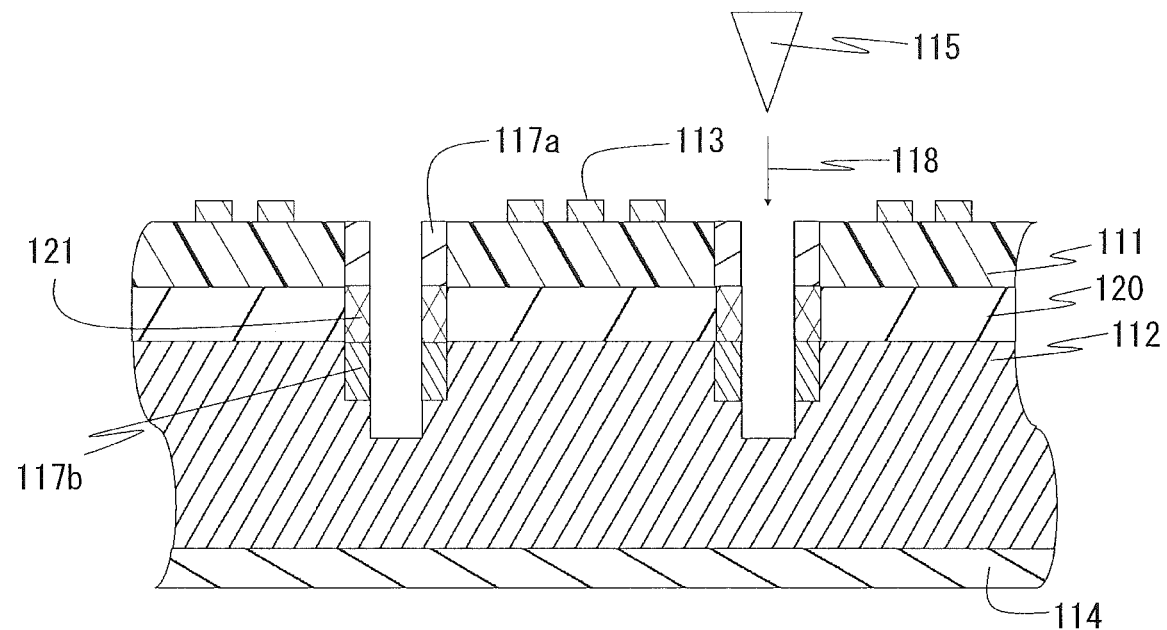
FIG. 20A and FIG. 20B are cross-sectional views (No. 4) illustrating the method of fabricating the acoustic wave device in accordance with the fourth embodiment.

As illustrated in FIG. 20A, the laser 118 is emitted from above the piezoelectric substrate 111 with use of the laser device 115. The laser 118 removes parts of the regions 117a and 117b, a part of the altered region 121, and a part of the support substrate 112, and forms the groove 119 in the support substrate 112. The depth of the groove 119 from the boundary face between the thin film layer 120 and the support substrate 112 is preferably approximately one-tenth of the thickness of the support substrate 112.

Figure 20B:
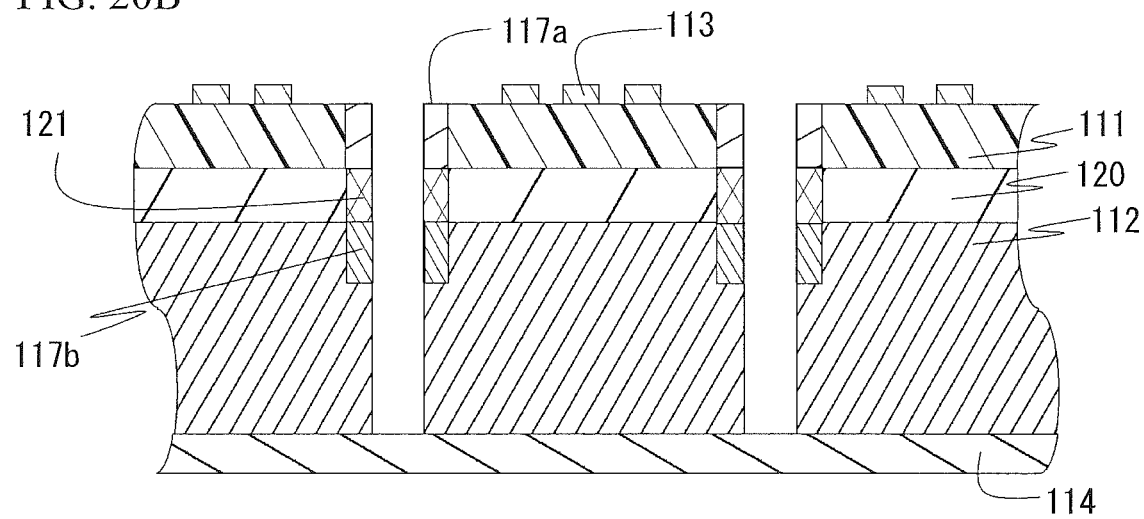

As illustrated in FIG. 20B, the piezoelectric substrate 111 and the support substrate 112 are split. The splitting method is, for example, a chocolate break method, or a tape expand method described above.

Figure 21:
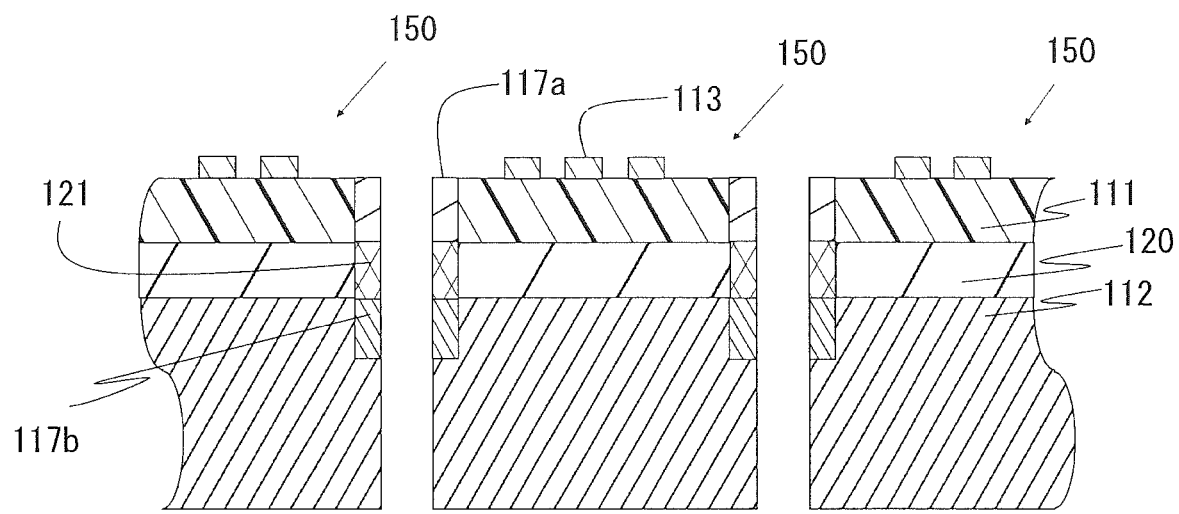
FIG. 21 is a cross-sectional view (No. 5) illustrating the method of fabricating the acoustic wave device in accordance with the fourth embodiment.

Through the above-described processes, the acoustic wave devices 150 are separated into the individual acoustic wave devices 150 as illustrated in FIG. 21.

Although the embodiments of the present invention have been described in detail, it is to be understood that the various change, substitutions, and alterations could be made hereto without departing from the spirit and scope of the invention.

What is claimed is:

1. An acoustic wave resonator comprising:
  a piezoelectric substrate;
  a pair of comb-shaped electrodes that is located on the piezoelectric substrate and excites an acoustic wave, each of the pair of comb-shaped electrodes including a plurality of electrode fingers; and
  a polycrystalline substrate that is a polycrystalline spinel substrate and is located at an opposite side of the piezoelectric substrate from a surface on which the pair of comb-shaped electrodes is located, an average particle size of the polycrystalline substrate being equal to or less than 66 times and equal to or greater than 1 time an average pitch of the plurality of electrode fingers.

2. The acoustic wave resonator according to claim 1, wherein
  the average particle size is equal to or less than 40 times the average pitch.

3. The acoustic wave resonator according to claim 1, further comprising
  an intermediate layer located between the piezoelectric substrate and the polycrystalline substrate.

4. The acoustic wave resonator according to claim 1, wherein
  a distance between a surface, closer to the piezoelectric substrate, of the polycrystalline substrate and the surface, on which the pair of comb-shaped electrodes is located, of the piezoelectric substrate is equal to or less than the average pitch.

5. The acoustic wave resonator according to claim 1, wherein
  the piezoelectric substrate is a 36° or greater and 42° or less rotated Y-cut X-propagation lithium tantalite substrate.

6. The acoustic wave resonator according to claim 1, wherein
a thickness of the polycrystalline substrate is equal to or greater than 2 times the average pitch and is equal to or greater than the average particle size.

7. The acoustic wave resonator according to claim 1, wherein the piezoelectric substrate and the polycrystalline substrate are directly bonded.

8. A filter comprising:
the acoustic wave resonator including:
a piezoelectric substrate;
a pair of comb-shaped electrodes that is located on the piezoelectric substrate
and excites an acoustic wave, each of the pair of comb-shaped electrodes including a plurality of electrode fingers; and
a polycrystalline substrate that is a polycrystalline spinel substrate and is located at an opposite side of the piezoelectric substrate from a surface on which the pair of comb shaped electrodes is located, an average particle size of the polycrystalline substrate being equal to or less than 66 times and equal to or greater than 1 time an average pitch of the plurality of electrode fingers.

9. An acoustic wave device comprising:
a pair of comb-shaped electrodes;
a piezoelectric substrate on which the pair of comb-shaped electrodes is located, the piezoelectric substrate having, in a side portion, a first region having a different crystal structure from a region overlapping with the pair of comb-shaped electrodes in plan view; and
a support substrate that is located at an opposite side of the piezoelectric substrate from the pair of comb-shaped electrodes, the support substrate having, in a side portion, a second region having a different crystal structure from a region overlapping with the pair of comb-shaped electrodes in plan view,
wherein
the second region is formed in a part, closer to the piezoelectric substrate, of the side portion of the support substrate, and is not formed in another part, further from the piezoelectric substrate, of the side portion of the support substrate.

10. The acoustic wave device according to claim 9, wherein
the first region overlaps with the second region in plan view,
the first region is amorphous,
the first region is formed across an entire surface of the side portion of the piezoelectric substrate, and
the second region is amorphous.

11. The acoustic wave device according to claim 9, wherein
the first region overlaps with the second region in plan view.

12. The acoustic wave device according to claim 9, wherein
the first region is amorphous.

13. The acoustic wave device according to claim 9, wherein
the first region is formed across an entire surface of the side portion of the piezoelectric substrate.

14. The acoustic wave device according to claim 9, wherein
the second region is amorphous.

15. The acoustic wave device according to claim 9, wherein
the support substrate and the piezoelectric substrate are bonded through a thin film layer.

16. The acoustic wave device according to claim 15, wherein
the thin film layer is mainly made of silicon dioxide or aluminum nitride.

17. The acoustic wave device according to claim 9, wherein
the support substrate is mainly made of polycrystalline spinel or polycrystalline silicon.

18. The acoustic wave device according to claim 9, wherein the support substrate is mainly made of monocrystalline spinel, sapphire, monocrystalline silicon, or crystalline quartz.

19. The acoustic wave device according to claim 9, wherein
the support substrate is a polycrystalline substrate.

* * * * *